(12) United States Patent
Maitani et al.

(10) Patent No.: US 6,656,828 B1
(45) Date of Patent: Dec. 2, 2003

(54) METHOD OF FORMING BUMP ELECTRODES

(75) Inventors: Touta Maitani, Tokyo (JP); Shinji Nishihara, Kokubunji (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/869,045

(22) PCT Filed: Jan. 22, 1999

(86) PCT No.: PCT/JP99/00253

§ 371 (c)(1), (2), (4) Date: Jun. 22, 2001

(87) PCT Pub. No.: WO00/44043

PCT Pub. Date: Jul. 27, 2000

(51) Int. Cl.[7] ................................................. H01L 21/44
(52) U.S. Cl. ........................................ 438/613; 438/614
(58) Field of Search ................................. 438/612, 613, 438/614, 108, 124, 126, 127; 257/690, 692, 737, 738, 778, 792

(56) References Cited

U.S. PATENT DOCUMENTS 5,130,274 A 7/1992 Harper et al. ............... 438/624
5,264,107 A * 11/1993 Bentson et al. ............... 205/86
6,218,281 B1 * 4/2001 Watanabe et al. ........... 438/612

FOREIGN PATENT DOCUMENTS

| JP | 1-202841 | 8/1989 |
|---|---|---|
| JP | 4-92432 | * 3/1992 |
| JP | 4-309229 | 10/1992 |
| JP | 5-102318 | 4/1993 |
| JP | 6-84832 | 3/1994 |
| JP | 8-330313 | 12/1996 |
| JP | 9-20942 | 1/1997 |
| JP | 9-36115 | 2/1997 |
| JP | 9-246274 | 9/1997 |

* cited by examiner

Primary Examiner—Tom Thomas
Assistant Examiner—Hung Kim Vu
(74) Attorney, Agent, or Firm—Mattingly, Stanger & Malur, P.C.

(57) ABSTRACT

A CSP in which bump electrodes (2) arranged in an area on a chip (1A) and bonding pads (BP) are electrically connected to each other via Cu interconnections (6), wherein the surface of the Cu interconnection (6) is covered with a barrier layer (14) to thereby prevent diffusion of Cu from the CU interconnection (6) into a polyimide resin layer (3) by a heat treatment during the manufacturing process.

4 Claims, 48 Drawing Sheets

METHOD OF FORMING BUMP ELECTRODES

TECHNICAL FIELD

The present invention relates to a semiconductor device and a method of manufacturing the same. More particularly, the invention relates to a technique effective for application to a chip size package (CSP) in which bump electrodes disposed in an area on a chip and bonding pads are electrically connected to each other through Cu interconnections.

BACKGROUND ART

In a process of manufacturing a high-speed LSI which operates at a high frequency, it is indispensable to adopt a low-resistant interconnection material and an insulating film material having a low dielectric constant to reduce electric resistance in an interconnection and capacity between interconnections. Since Cu has low electric resistance which is about two third of that of Al and has high EM (electromigration) resistance, Cu is being used more and more for a high speed logic LSI, a microcomputer, and the like which need a low-resistant fine interconnection.

A Cu interconnection is formed by what is called the Damascene process of burying a Cu film in a groove or a through hole formed in an insulating film for the reason such that a photoresist having excellent etch selectivity has not been developed yet. When the Cu film is buried, plating, sputtering, or the like is used. Since it is requested to bury a Cu film in a groove or a through hole having a high aspect ratio to form a fine interconnection, plating having excellent burying characteristics is more advantageous than sputtering.

Cu has, however, the following problems. (a) Cu has oxidation resistance lower than that of Al. Oxidation progresses to the inside of an interconnection by heat or the like generated at the time of depositing an insulating interlayer, and electric resistance increases. (b) Cu has low strength of bonding to an insulating material including oxygen such as silicon oxide or polyimide resin. (c) Cu is easily diffused into silicon and a silicon oxide. When Cu is in contact with a diffusion layer of the substrate, the characteristics of a device deteriorate. In the process of manufacturing an LSI using Cu as a material of an interconnection, countermeasures against those problems are necessary.

Japanese Unexamined Patent Application No. Hei 4(1992)-309229 discloses a technique of covering the surfaces (top and under faces and both sides) of a Cu-based interconnection with a thin oxidation preventing layer to prevent oxidation of the Cu-based interconnection, to prevent diffusion of Cu into silicon and a silicon oxide, and to improve adhesion to a silicon oxide film. The oxidation preventing layer is made of an oxide or nitride stabler than a Cu oxide, such as a refractory metal silicide containing free silicon, an alloy of Cu and another metal or silicon, or refractory metal nitride.

Japanese Unexamined Patent Application No. Hei 5(1993)-102318 discloses a technique such that, when a plug made of a Cu alloy is formed in a connection hole (via) opened in an insulating layer containing oxygen, a thin layer made of an oxide of the alloy element (for example, chromium oxide or aluminum oxide) on a top face of the Cu alloy plug and a contact face with the insulating layer containing oxygen. The thin film layer functions as an adhesion layer, diffusion barrier for preventing the diffusion of Cu, and also as a surface protective layer to provide the Cu alloy with corrosion resistance.

Japanese Unexamined Patent Application No. Hei 9(1997)-36115 discloses a technique of forming a Cu interconnection in a groove by forming a plurality of grooves at predetermined intervals in an insulating interlayer, depositing a Cu thin film on the insulating interlayer so as to bury the grooves, and removing the Cu thin film on the insulating interlayer by chemical mechanical polishing (CMP) or the like. To reduce parasitic capacity between Cu interconnections, the insulating interlayer in which grooves are formed is made of a photosensitive polyimide resin having a lower dielectric constant than that of silicon oxide or silicon nitride. A thin Cr layer as a metal underlayer of the Cu interconnection is formed on the bottom and side walls of the groove. By the Cr layer, close adhesion between the Cu interconnection and the photosensitive polyimide resin is assured, and the oxidation of the contact face with the silicon oxide film as an underlayer, of the Cu interconnection is prevented.

The inventors of the present invention are now developing a process for manufacturing a high speed LSI by a fine design rule of 0.2 $\mu$m or smaller. To improve the operating speed of the chip, the high speed LSI employs the flip chip bonding by which the distance between a connection terminal on the outside of a chip to a mother board can be made shortest. The high speed LSI also adopts an area array structure in which bump electrodes serving as external connection terminals are arranged in a central area on a chip.

The area array structure has an advantage such that a number of pins can be arranged more easily as compared with a structure (peripheral structure) in which bump electrodes are arranged on bonding pads arranged in the peripheral area of the chip. In the area array structure in which a wider space can be assured between neighboring bump electrodes, a larger diameter of the bump electrode can be allowed. Consequently, stress which occurs due to a difference between a coefficient of thermal expansion of the chip and that of the mother board can be lessened by the bump electrodes, so that the reliability of connection of the chip is increased.

To manufacture an LSI having the area array structure, interconnections for connecting bonding pads arranged in the peripheral portion of the chip and bump electrodes arranged in the whole surface of the chip, what is called re-arrangement interconnections are necessary. In the case of an LSI in which emphasis is placed on high-speed operation, it is desirable to make the re-arrangement interconnections of Cu for the above-described reasons.

It is also desirable to form the re-arrangement interconnections in a wafer process (pre-process) more than in an assembling process (post-process) which is performed after a wafer is diced into chips. Specifically, formation of the re-arrangement interconnections and the following formation of bump electrodes is performed in the wafer process, after that, a wafer is divided into a plurality of chips, and chip size packages (CSP) are formed. In such a manner, the package assembling process (post-process) becomes unnecessary. Thus, a CSP adapted to a high packing density and high-speed operation can be manufactured at low cost and in a short period of development.

The inventors examined processes as follows to manufacture a CSP in which bump electrodes arranged in an area on the chip and bump electrodes are electrically connected via the re-interconnections of Cu.

First, in a manner similar to a normal wafer process, semiconductor elements are formed on the principal face of a wafer, a plurality of interconnections (signal interconnections and power source interconnections) are formed on the semiconductor elements, and a passivation film is formed on the uppermost interconnection. The passivation film is a closely-packed insulating film such as a silicon nitride film (or a stacked film of a silicon nitride film and a silicon oxide film) formed by plasma CVD, and functions as a surface protective film for preventing intrusion by moisture and a foreign matter into an integrated circuit from the wafer surface.

Subsequently, a polyimide resin layer is formed on the passivation film, the polyimide resin layer and the passivation film under the polyimide resin layer are etched to expose a part of the uppermost interconnection, thereby forming a bonding pad. The bonding pads are arranged along the peripheral portion of the chip area defined on the principal face of the wafer.

A Cu film is deposited by sputtering on the polyimide resin layer and the bonding pads to thereby form a feeder layer. A photoresist film formed on the feeder layer is exposed and developed, thereby forming a long groove having one end extending on the bonding pad and the other end extending in a bump electrode connection area.

Subsequently, the Cu interconnection is formed by electrolytic plating on the inside of the long groove formed in the photoresist film, and a metal film made of Ni, Cr, or the like is formed on the Cu interconnection by electrolytic plating. The metal film functions as a metal underlayer of the bump electrode to be connected onto the Cu interconnection in a later process.

The photoresist film is removed, the feeder layer which becomes unnecessary is removed by etching using the Cu interconnection as a mask, a polyimide resin film is spin-coated on the Cu interconnection, and heat treatment (pre-baking) is performed to volatilize a solvent in the polyimide resin film.

A photoresist film in which a bump electrode connection area is opened is formed as an upper layer of the polyimide resin film. The polyimide resin film is removed by etching using the photoresist film as a mask to expose the Cu interconnection, thereby forming a pad.

The photoresist film is removed, heat treatment (post-baking) of 350° C. to 400° C. is performed to cure the polyimide resin film, and bump electrodes are connected onto the pad. After that, the wafer is diced into a plurality of chips, thereby completing CSPs.

In the CSP employing the area array structure, however, since the bump electrodes disposed in the center area of the chip are electrically connected to the bonding pads arranged in the peripheral portion of the chip via the Cu interconnections, in the center area of the chip, a plurality of Cu interconnections are routed between the bump electrodes at high density. Consequently, in the case of manufacturing a CSP by the process as described above, in the step of performing the heat treatment (post-baking) on the polyimide resin film formed on the Cu interconnections, there is the possibility that the Cu interconnections are short-circuited.

The cause of the short circuit can be considered that a carboxyl group in a polyimide precursor existing in the polyimide resin which is not cured yet is coupled with Cu in the interconnection at the time of cure, thereby causing diffusion of Cu. Usually, the diffusion of Cu as described above does not occur in the cured polyimide resin. In the case where the Cu interconnections are disposed apart from each other, no problem occurs even when Cu is diffused into the polyimide resin near the Cu interconnection. When a CSP having a number of pins or a shrunk chip size adopts the area array structure, a plurality of Cu interconnections are disposed very close to each other. Consequently, a short circuit occurs more frequently when a process as described above is employed.

An object of the invention is therefore to provide a technique capable of preventing a short circuit in Cu interconnections caused by heat treatment in a manufacturing step in a CSP in which bump electrodes disposed in an area on a chip and bonding pads are electrically connected to each other via the Cu interconnections, and realizing a CSP adapted to high-packing-density mounting and high-speed operation.

Another object of the invention is to provide a technique capable of shortening the process of manufacturing a CSP in which bump electrodes arranged in an area on a chip and bonding pads are electrically connected to each other via Cu interconnections.

The above and other objects and novel features of the invention will become apparent from the description of the specification and the accompanying drawings.

DISCLOSURE OF INVENTION

In the invention disclosed in the application, a representative mode will be briefly described as follows.

In a semiconductor device of the invention, a Cu interconnection and a polyimide resin layer covering the Cu interconnection are formed on an insulating film covering an uppermost interconnection of a chip on which a semiconductor element as a component of an integrated circuit and a predetermined number of interconnections are formed, one end of the Cu interconnection is electrically connected to a bonding pad formed by opening the insulating film to expose a part of the uppermost interconnection, and a bump electrode is connected to a pad formed by opening the polyimide resin layer to expose the other end of the Cu interconnection. A barrier layer for preventing Cu from being diffused into the polyimide resin layer is formed on the surface of the Cu interconnection.

A method of manufacturing a semiconductor device according to the invention includes the following steps of:
(a) forming a semiconductor element as a component of an integrated circuit and a predetermined number of interconnections on a principal face of a wafer and forming an insulating film on an uppermost interconnection;
(b) forming a bonding pad by opening said insulating film to expose a part of said uppermost interconnection;
(c) forming a long groove of which one end extends over said bonding pad and of which other end extends in a bump electrode connection region by forming a photoresist film over said insulating film and also said bonding pad and thereafter exposing and developing said photoresist film;
(d) forming a Cu interconnection in said long groove formed in said photoresist film;
(e) removing said photoresist film and, after that, covering the surface of said Cu interconnection with a barrier layer;
(f) forming a pad by forming a polyimide resin layer over said Cu interconnection on which said barrier layer is formed, and opening said polyimide resin layer in said bump electrode connection region to expose a part of said Cu interconnection;
(g) curing said polyimide resin layer by heating; and
(h) connecting a bump electrode onto said pad.

According to the invention, by covering the surface of the Cu interconnection with the barrier layer, a short circuit in the Cu interconnections caused by a heat treatment in a manufacturing process can be prevented.

BEST MODE FOR CARRYING OUT THE INVENTION

Figure 1:
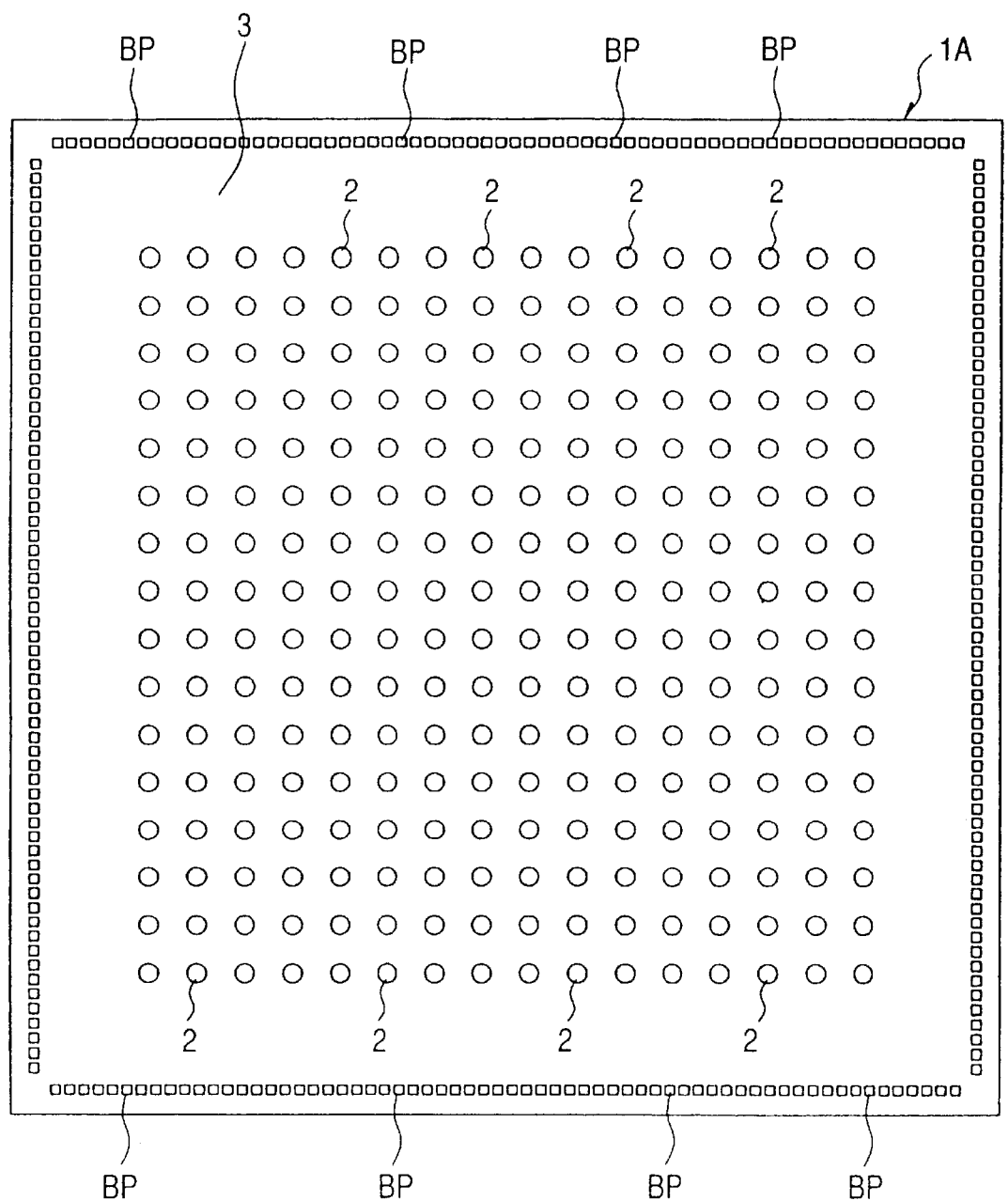
FIG. 1 is a plan view showing a semiconductor device as a first embodiment of the invention.

Embodiments of the invention will be described in detail hereinbelow with reference to the drawings. In all the drawings for explaining the embodiments, components having the same function are designated by the same reference numerals and their repetitive description will not be made.

First Embodiment

Figure 2:
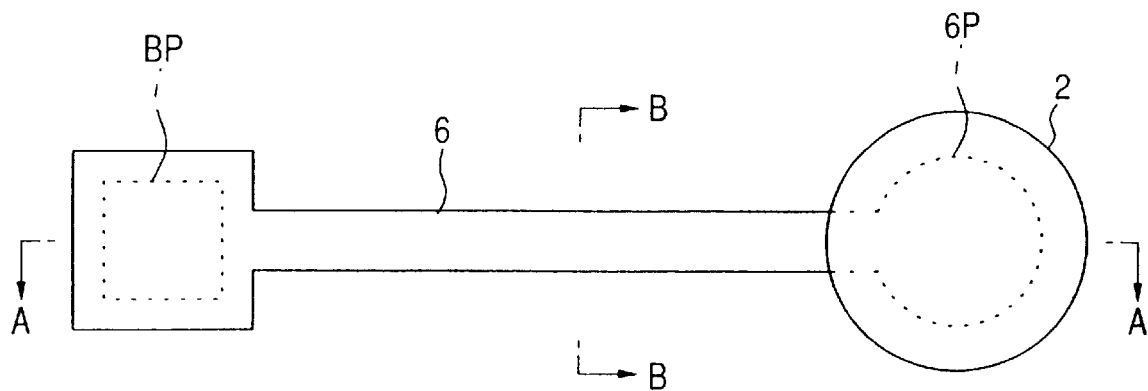
FIG. 2 is a plan view showing an enlarged part of FIG. 1.
Figure 3:
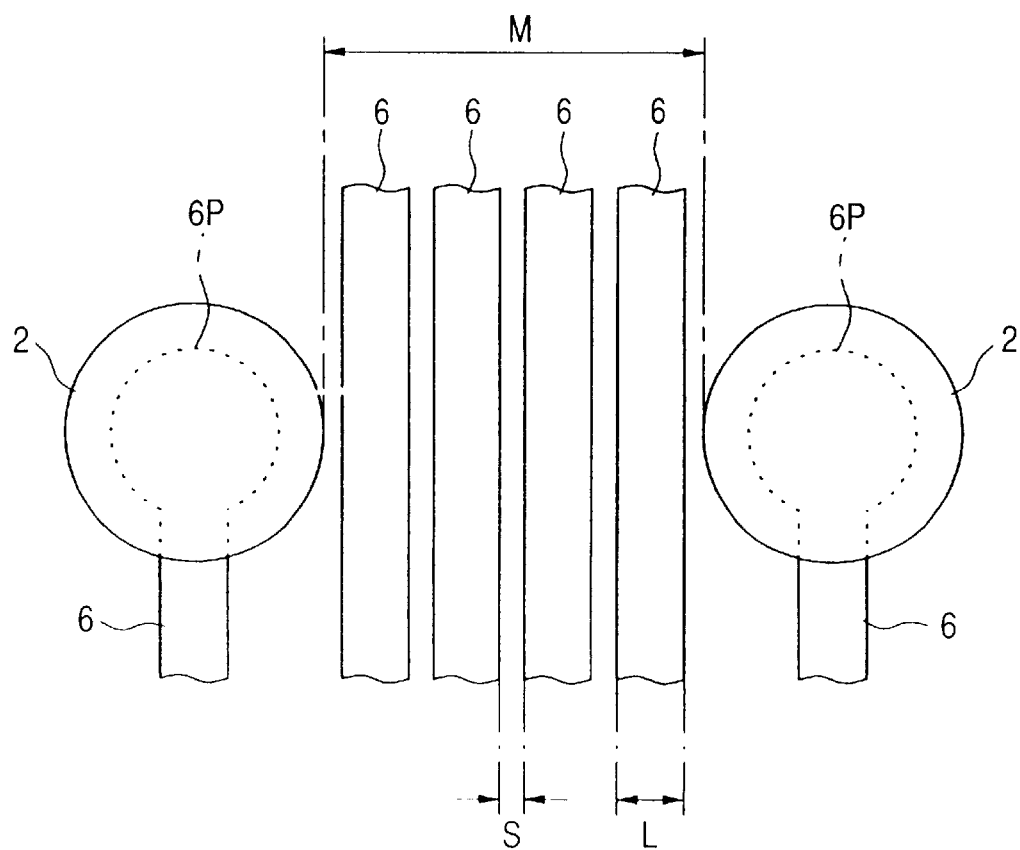
FIG. 3 is a plan view showing enlarged another part of FIG. 1.
Figure 4:
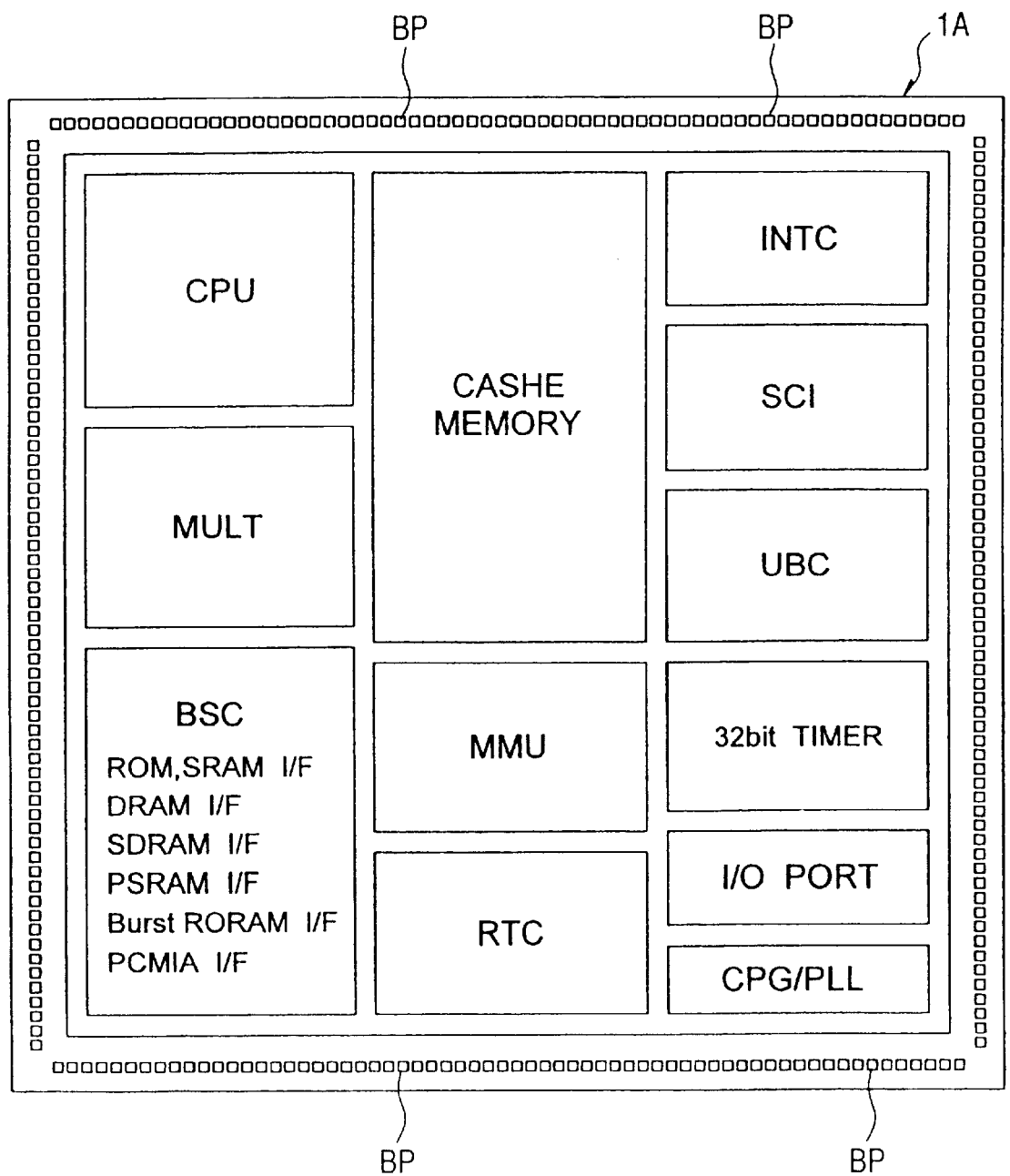
FIG. 4 is a block diagram of the semiconductor device as the first embodiment of the invention.

FIG. 1 is a plan view showing a semiconductor device as an embodiment, FIG. 2 is a plan view showing an enlarged part of FIG. 1, FIG. 3 is a plan view showing another enlarged part of FIG. 1, and FIG. 4 is a block diagram of the semiconductor device.

A semiconductor device of the embodiment is a chip size package (CSP) in which a plurality of bump electrodes 2 are arranged in an area on a principal face (integrated circuit forming face) of a chip 1A made of single crystal silicon. As shown in FIG. 1, the bump electrodes 2 serving as external connection terminals of the CSP are arranged at equivalent intervals in the central area of the chip 1A. In the center area of the chip 1A where the bump electrodes 2 are arranged, for example, a microcomputer as shown in FIG. 4 is disposed. In the peripheral portion of the chip 1A, a plurality of bonding pads BP are arranged in a line along each of the sides.

For example, the external dimensions of the chip 1A are 1 mm long and 1 mm wide, the number of the bump electrodes 2 is 256, and the number of the bonding pads BP is 256. The diameter of the bump electrode 2 is, for instance, 300 $\mu$m (micrometers), and the external dimensions of the bonding pad BP are, for example, 100 $\mu$m long and 100 $\mu$m wide.

The surface of the chip 1A is covered with a polyimide resin layer 3. The bump electrodes 2 are connected on pads 6P (refer to FIGS. 2 and 3) formed by opening the polyimide resin layer 3. Each of the bonding pads BP is formed by opening a polyimide resin layer 4 and a passivation film 5 (which are not shown in FIGS. 1 to 4) under the polyimide resin layer 3 and exposing a part of the uppermost interconnection.

As shown in FIG. 2, the bump electrode 2 and the bonding pad BP are electrically connected to each other via a Cu interconnection 6 (re-arranging interconnection). The Cu interconnection 6 is formed between the polyimide resin layer 3 and the polyimide resin layer 4 below the polyimide resin layer 3. One end of the Cu interconnection 6 extends on the bonding pad BP. The other end of the Cu interconnection 6 extends below the bump electrode 2 to thereby form the pad 6P. The width of the Cu interconnection 6 is, for example, 25 $\mu$m.

As described above, in the CSP of the embodiment, each of the bump electrodes 2 arranged in the central area of the chip 1A and each of the bonding pads BP arranged in the peripheral portion of the chip 1A are electrically connected to each other via the Cu interconnection 6. Consequently, in the central area of the chip 1A, as shown in FIG. 3, a plurality of Cu interconnections 6 are routed at high density between the neighboring bump electrodes 2. For example, when it is assumed that a space (M) between the bump electrodes 2, 2 is 120 $\mu$m, the number of Cu interconnections 6 extending in the space (M) is four, and the width (L) of the interconnection is 25 $\mu$m, the space (S) between the neighboring Cu interconnections 6, 6 is as extremely narrow as only 4 $\mu$m.

Figure 5:
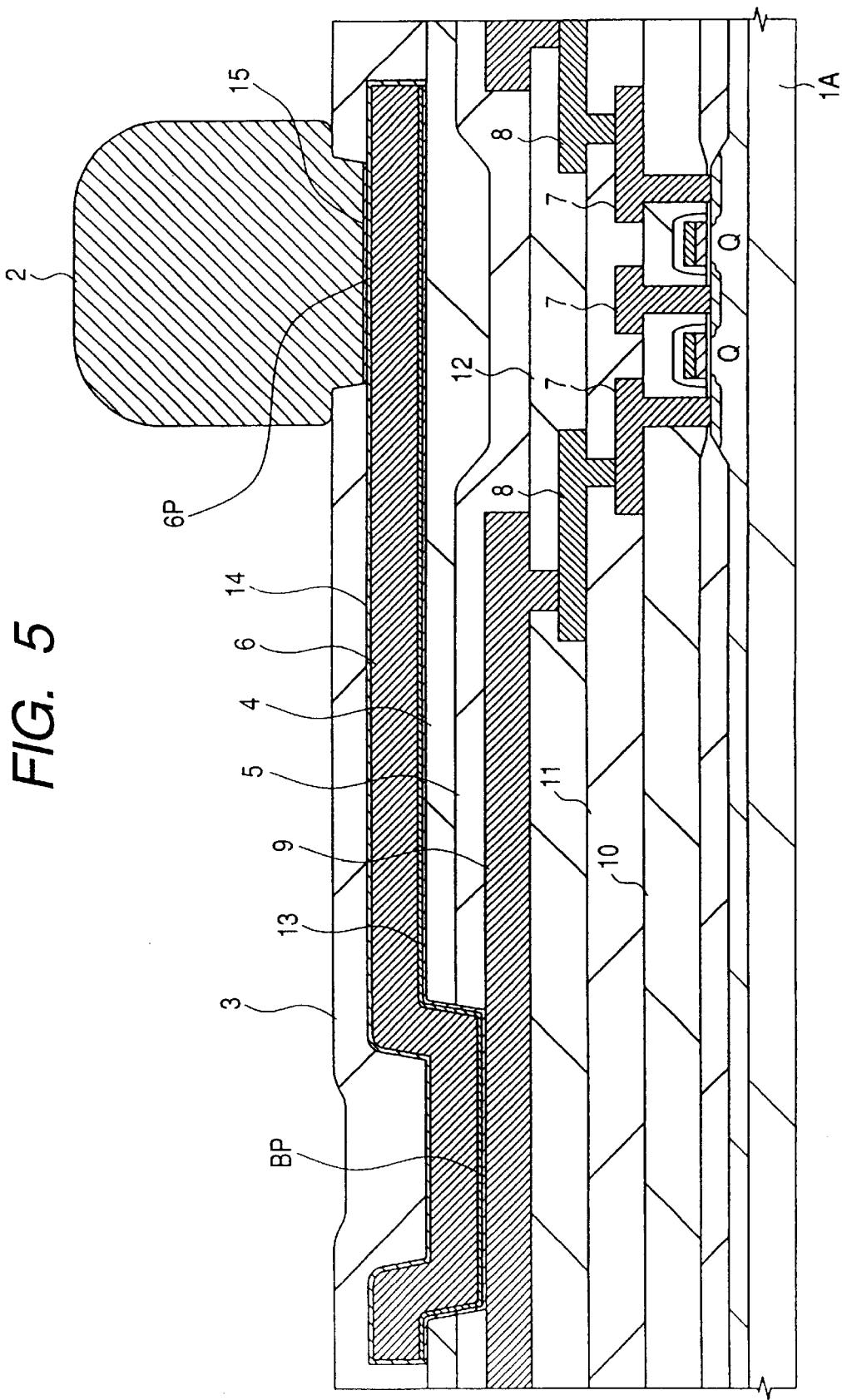
FIG. 5 is a cross section of a main portion of a chip, taken along line A—A of FIG. 2.
Figure 6:
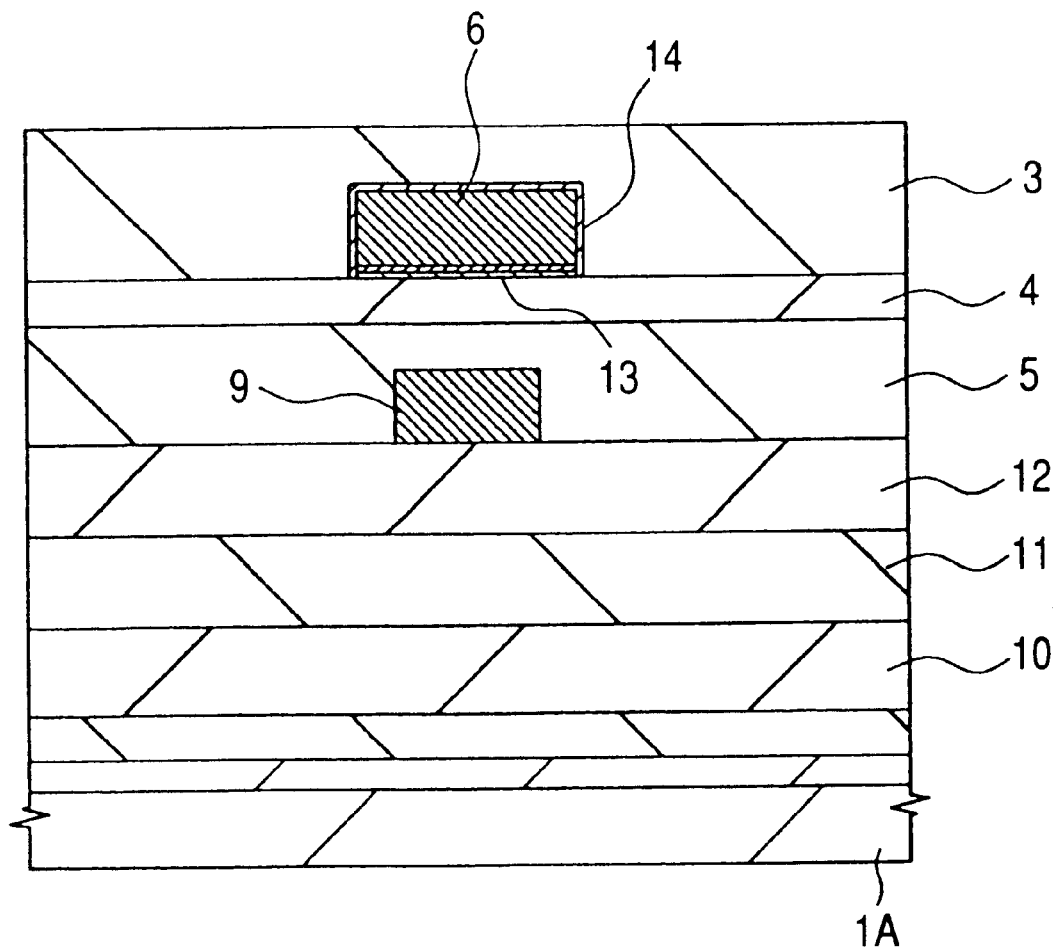
FIG. 6 is a cross section of a main portion of a chip, taken along line B—B of FIG. 2.

The internal structure of the chip 1A will now be described by using FIG. 5 (cross section of a main portion of the chip 1A, taken along line A—A of FIG. 2) and FIG. 6 (cross section of a main portion of the chip 1A, taken along lien B—B of FIG. 2).

As shown in the drawings, on the principal face of the chip 1A, MISFETs (Metal Insulator Semiconductor Field Effect Transistors) Q as components of a microcomputer and three-layer Al interconnections (signal interconnection and power source interconnection) 7, 8, and 9 are formed. A silicon oxide film 10 is formed between the MISFET Q and the Al interconnection 7, a silicon oxide film 11 is formed between the Al interconnection 7 and the Al interconnection 8, and a silicon oxide film 12 is formed between the Al interconnection 8 and the Al interconnection 9.

The passivation film 5 is formed on the Al interconnection 9 as the uppermost interconnection. The passivation film 5 is constructed by a silicon nitride film which is dense and has excellent moisture resistance to prevent intrusion by moisture and a foreign matter to an integrated circuit from the surface of the chip 1A.

The polyimide resin layer 4 is formed on the passivation film 5, and the above-described Cu interconnection 6 is formed on the polyimide resin layer 4. One end of the Cu interconnection 6 is electrically connected to the bonding pad BP formed by opening the polyimide resin layer 4 and the passivation layer 5 under the polyimide resin layer 4 to expose a part of the Al interconnection 9.

The polyimide resin layer 4 is formed to lessen the stress of the Cu interconnection 6 itself and the stress transmitted from the bump electrode 2 to the Cu interconnection 6. By interposing the polyimide resin layer 4 made of an insulating material of which dielectric constant is lower than that of a silicon nitride film between the Cu interconnection 6 and the Al interconnection 9 sandwiching the passivation film 5 as a silicon nitride film made of an insulating material having a relatively high dielectric constant, parasitic capacitance generated between the Cu interconnection 6 and the Al interconnection 9 can be reduced. The polyimide resin layer 4 is made of a photosensitive polyimide resin to simplify the process of manufacturing the CSP which will be described hereinlater. When the stress of the Cu interconnection 6 and the parasitic capacitance are not a problem, the polyimide resin layer 4 may be omitted and the Cu interconnection 6 may be formed directly on the passivation film 5.

Under the Cu interconnection 6, a feeder layer 13 is formed. As will be described hereinlater, the feeder layer 13 is used to form the Cu interconnection 6 by electrolytic plating. The feeder layer 13 is constructed by two metal films in such a manner that a Cu film is stacked on a Cr film. The Cr film as a lower layer is formed to improve the bonding strength between the Cu film as the substantial feeder layer 13 and the polyimide resin layer 4 under the feeder layer 13 and to prevent diffusion of Cu from the Cu film to the polyimide resin layer 4.

On the surface of the feeder layer 13 and the surface of the Cu interconnection 6 on the feeder layer 13, that is, on the side walls of the feeder layer 13 and the side walls and the top face of the Cu interconnection 6, a barrier layer 14 is formed. As the barrier layer 14, for example, an Ni film formed by electroless plating is used.

On the Cu interconnection 6, that is, as the uppermost layer of the chip 1A, the polyimide resin layer 3 is formed. The polyimide resin layer 3 is formed to protect the surface of the Cu interconnection 6, lessen the stress of the Cu interconnection 6 itself, and lessen the stress transmitted from the bump electrode 2 to the Cu interconnection 6. As described above, since the barrier layer 14 as the Ni film is formed on the surface of the Cu interconnection 6, the polyimide resin layer 3 covering the Cu interconnection 6 and the Cu interconnection 6 are not in direct contact with each other.

On the polyimide resin layer 3, the pump electrode 2 is formed. The bump electrode 2 is connected to the pad 6P formed by opening the polyimide resin layer 3 to expose the barrier layer 14 covering the surface of the Cu interconnection 6. The bump electrode 2 is formed by using, for example, a solder made of an alloy of Sn (63%)/Pb (37%). The Ni film (barrier layer 14) formed on the surface of the Cu interconnection 6 also functions as a barrier layer for preventing what is called "solder eating" that the solder making the bump electrode 2 erodes the Cu interconnection 6. On the surface of the pad 6P, a second metal underlayer 15 is formed to prevent oxidation of the barrier layer 14. The second metal underlayer 15is constructed by, for example, an Au film formed by electroless plating.

A method of manufacturing the semiconductor device (CSP) constructed as described above will now be explained by referring to FIGS. 7 to 23.

Figure 7:
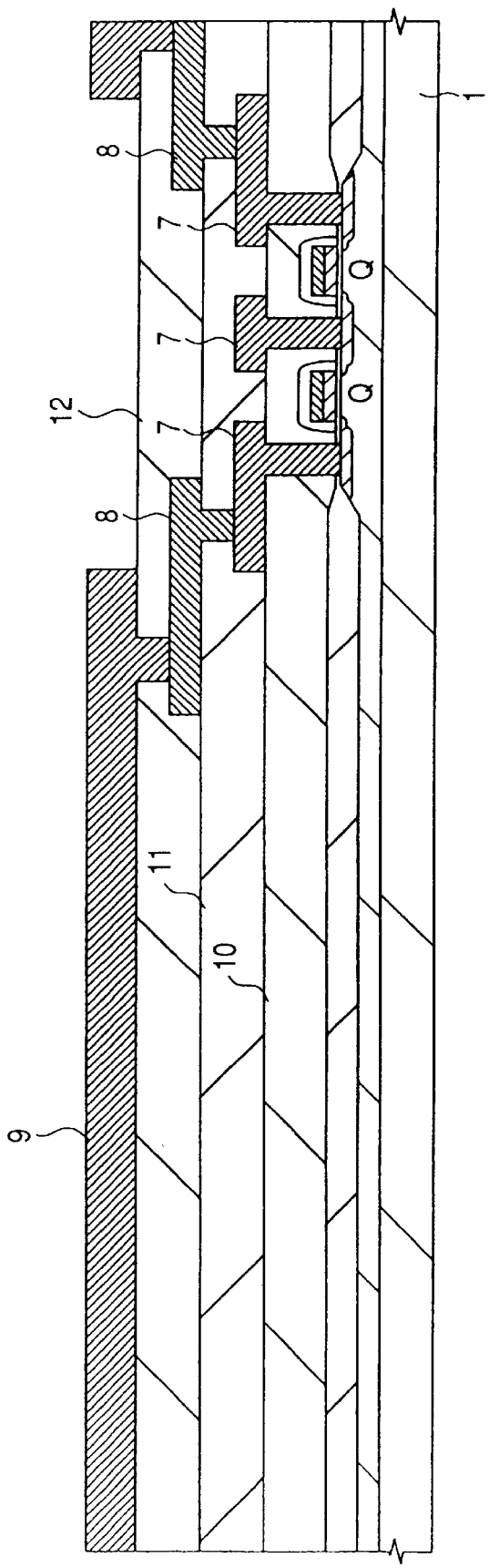
FIGS. 7 to 22 are cross sections each of a main portion of a wafer, showing a method of manufacturing the semiconductor device as the first embodiment of the invention.
Figure 8:
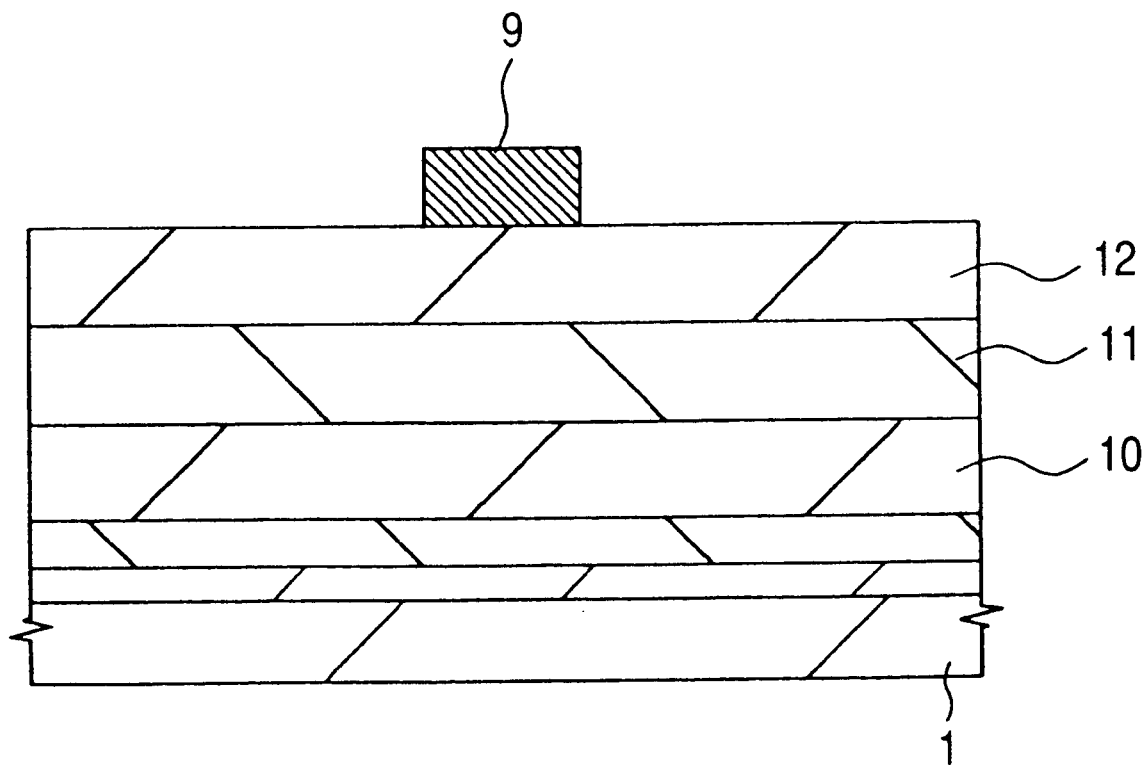

First, as shown in FIGS. 7 and 8, according to an ordinary wafer process, the MISFETs Q are formed on the principal face of a wafer 1 made of single crystal silicon, and the silicon oxide films 10, 11, and 12 and the Al interconnections 7, 8, and 9 are alternately formed on the MISFETs Q. The silicon oxide films 10, 11, and 12 are deposited by CVD, and the Al interconnections 7, 8, and 9 are formed by dry-etching an Al film deposited by sputtering. A semiconductor element as a component of an integrated circuit may be a combination of, for example, an MISFET and a bipolar transistor, or a combination of an active device such as the above devices and a passive device such as a capacitor or a resistor. An interconnection may be made of W (tungsten) or Cu, and the number of wiring layers may be four or more.

Figure 9:
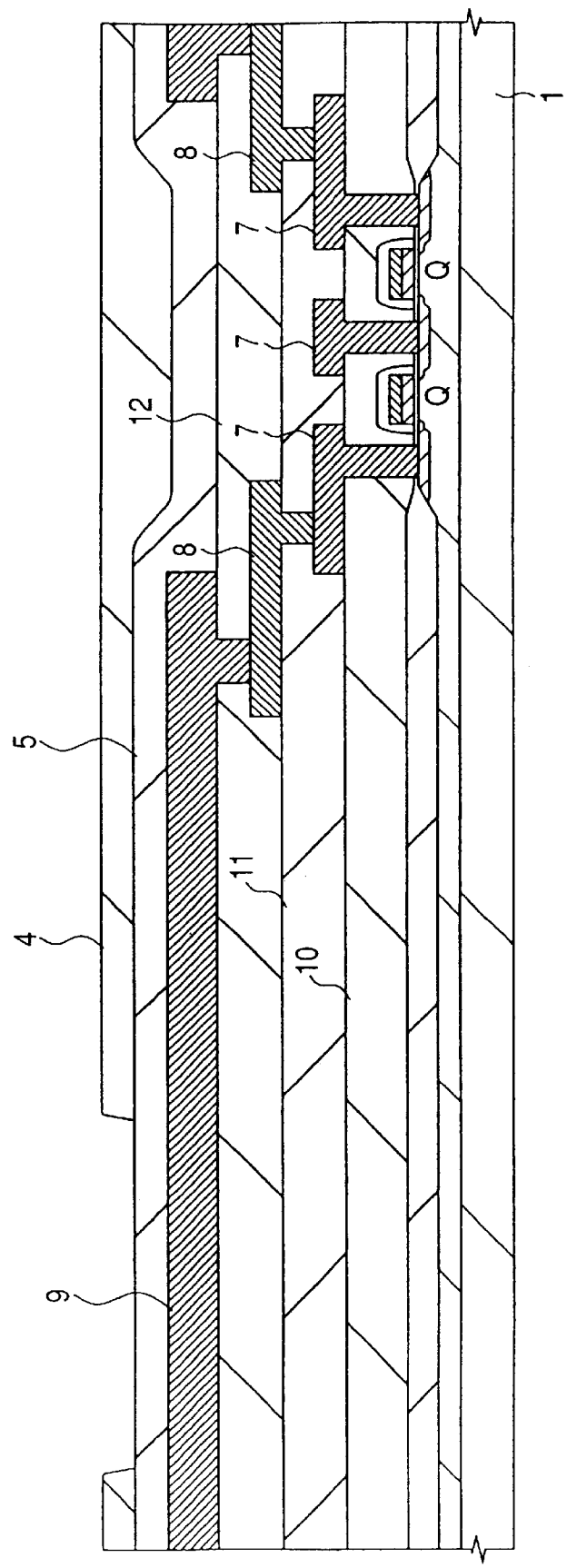

As shown in FIG. 9, a silicon nitride film is deposited on the Al interconnection 9 by plasma CVD to form the passivation film 5, and the polyimide resin layer 4 in which a bonding pad forming region is opened is formed on the passivation film 5. The passivation film 5 may be a stacked film of a silicon nitride film and a silicon oxide film deposited by CVD.

The polyimide resin layer 4 is formed as follows. First, a photosensitive polyimide resin film having a thickness of about 5 to 15 $\mu$m is spin-coated on the passivation film 5, and heat treatment (pre-baking) at 120° C. for about 30 seconds is performed to volatilize the solvent in the polyimide resin film. Subsequently, the polyimide resin film is exposed and developed to open the bonding pad forming region. After that, heat treatment (post-baking) at 350° C. to 400° C. for about three hours is performed to cure the polyimide resin film.

Figure 10:
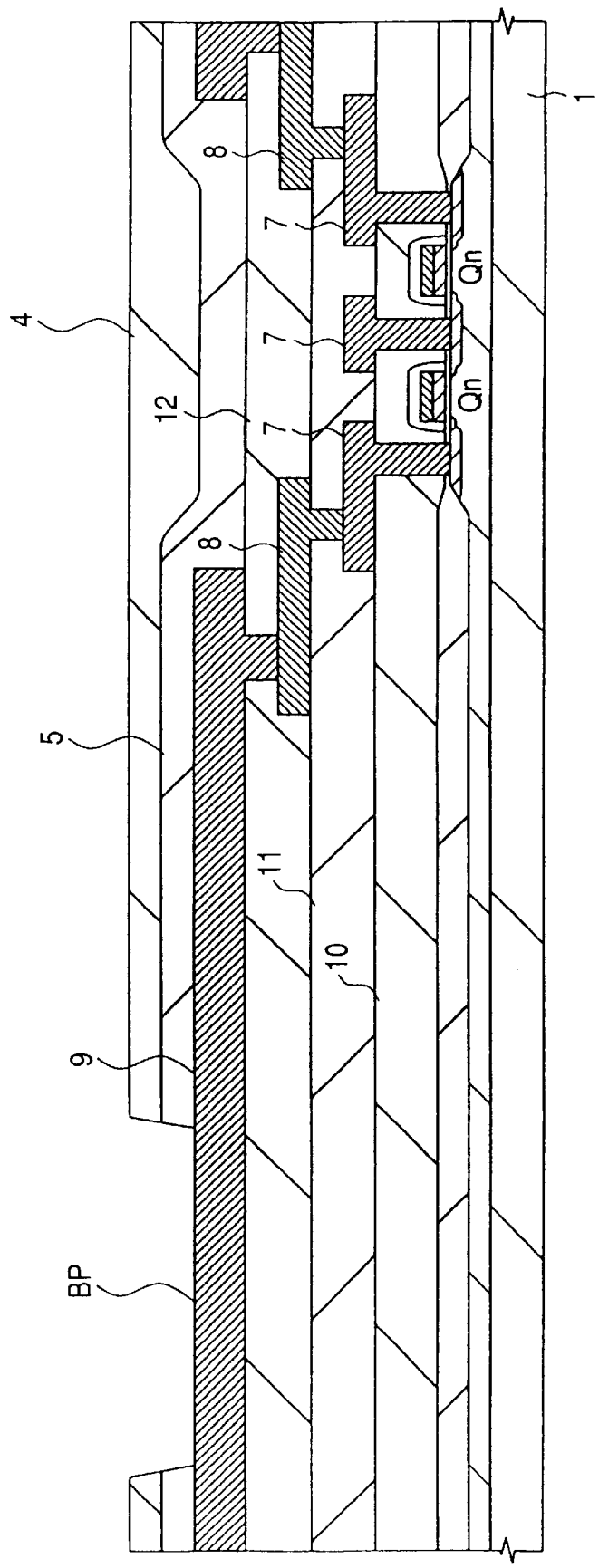

As shown in FIG. 10, the passivation film 4 as a lower layer is dry-etched by using the above polyimide resin layer 4 as a mask to expose a part of the Al interconnection 9, thereby forming the bonding pad BP. As described above, in the embodiment, the polyimide resin layer 4 is made of a photosensitive polyimide resin. Accordingly, the step of applying a photoresist film on the polyimide resin which is spin-coated on the passivation film 5, and opening a hole in the polyimide resin by dry etching using the photoresist film as a mask, as in the case of making the polyimide resin layer 4 of a non-photosensitive polyimide resin, becomes unnecessary, so that the process of manufacturing the CSP can be shortened.

Figure 11:
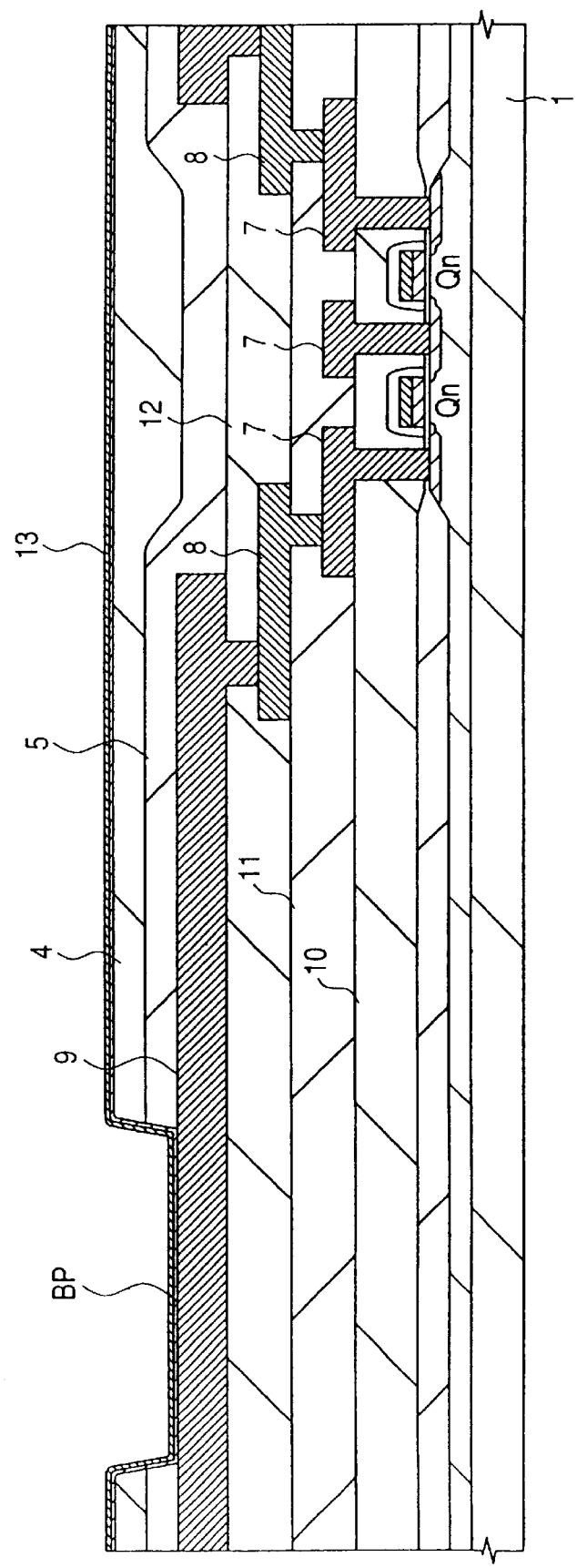

As shown in FIG. 11, the feeder layer 13 is formed on the polyimide resin layer 4 also on the bonding pad BP. The feeder layer 13 is formed in such a manner that a thin Cr film having a thickness of about 0.07 $\mu$m to 0.1 $\mu$m is deposited on the polyimide resin layer 4 by sputtering and a Cu film having a thickness of about 0.5 $\mu$m is deposited on the Cr film by sputtering.

Figure 12:
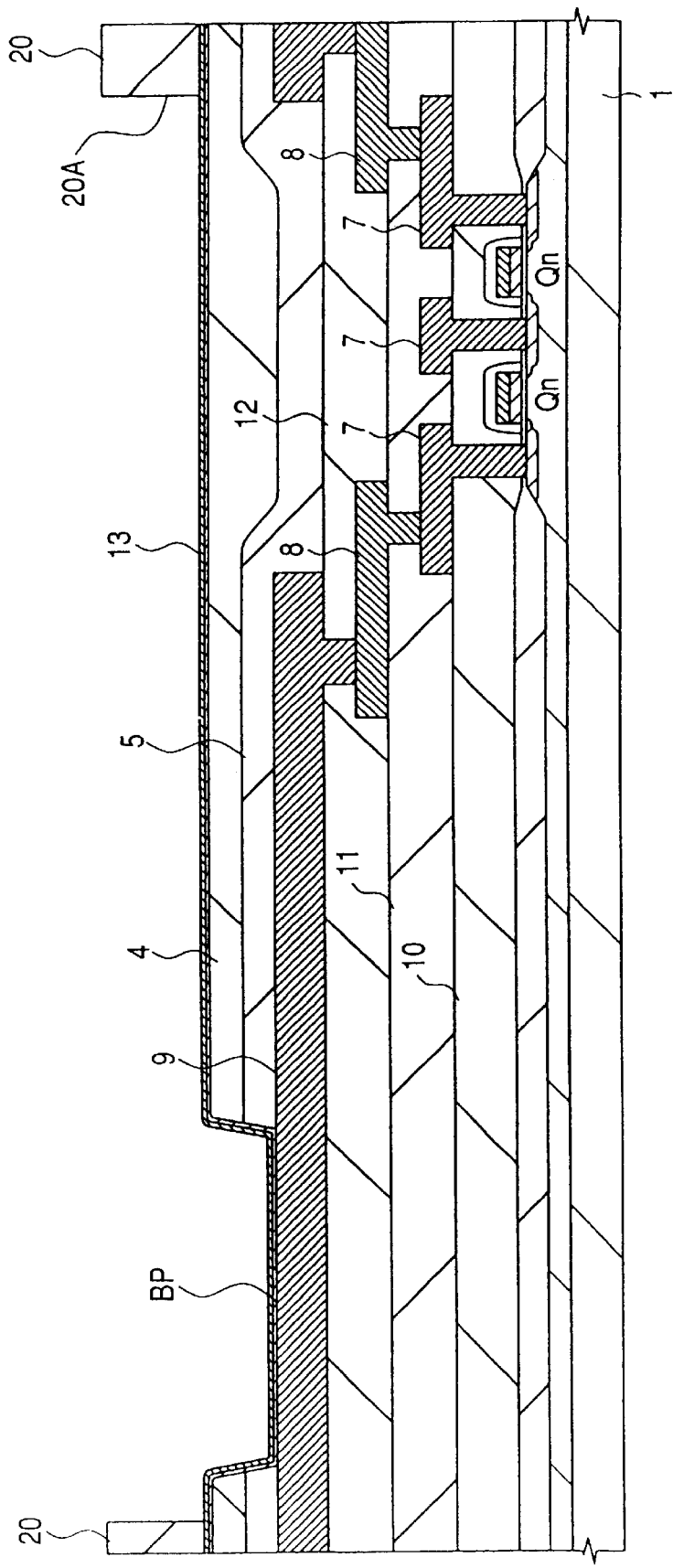
Figure 13:
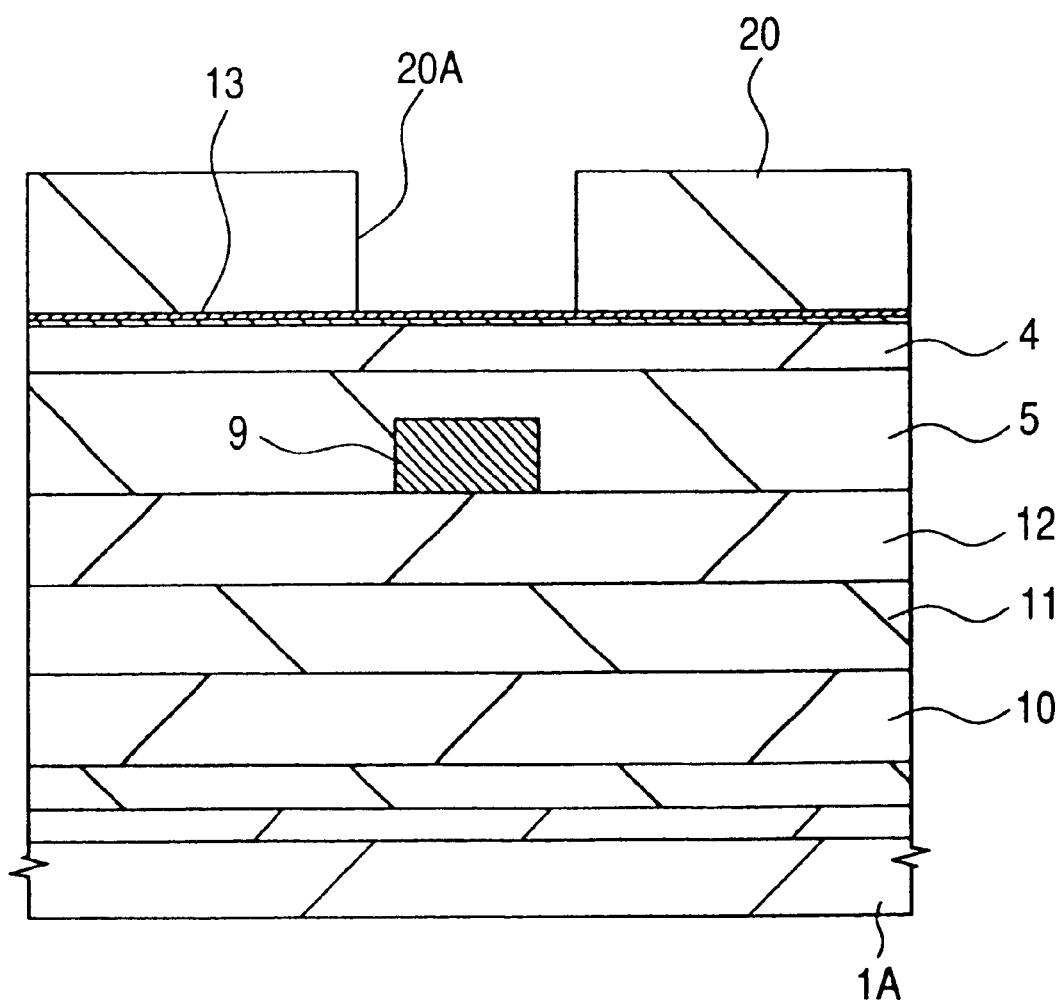

As shown in FIGS. 12 and 13, by exposing and developing a photoresist film 20 spin-coated on the feeder layer 13, a long groove 20A having one end extending onto the bonding pad BP and the other end extending to a bump electrode connection region is formed in the photoresist film 20.

Figure 14:
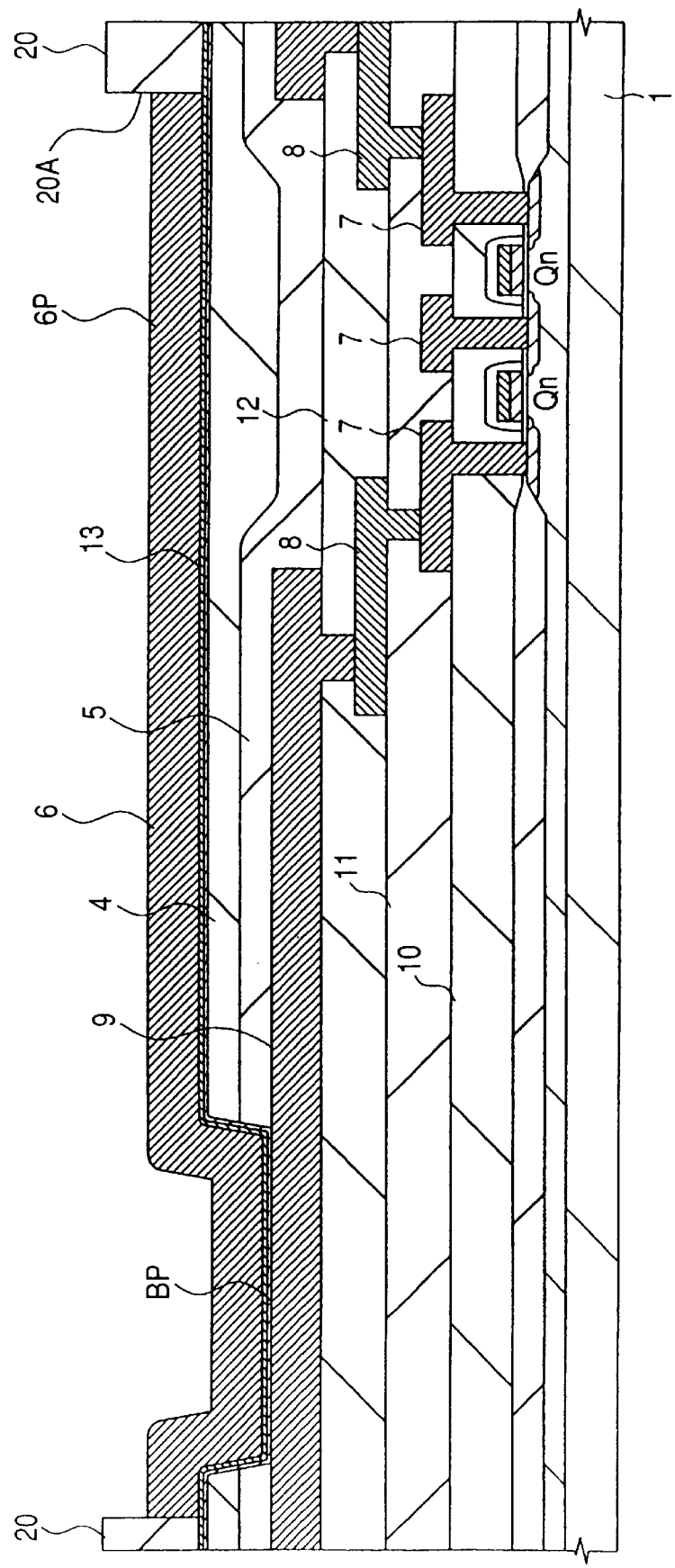
Figure 15:
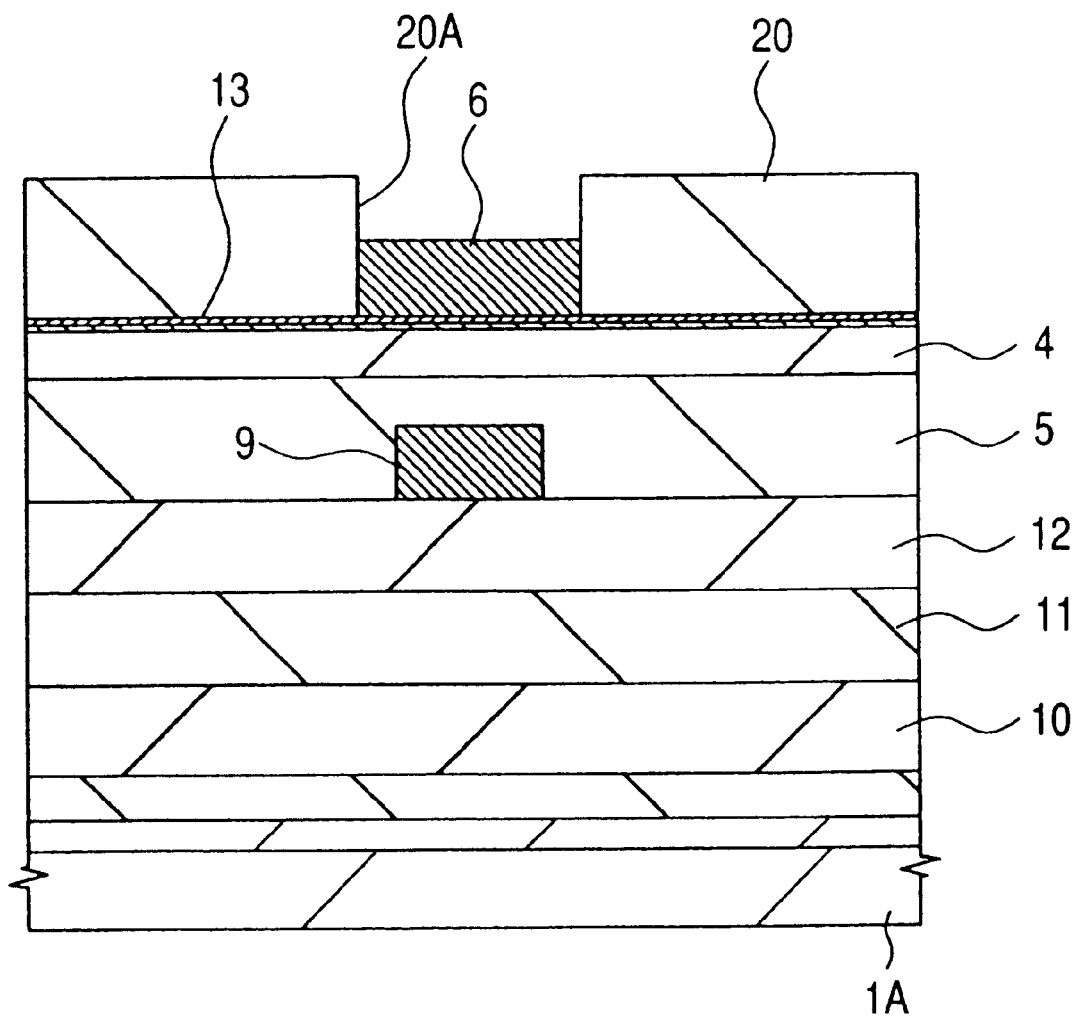

As shown in FIGS. 14 and 15, the Cu interconnection 6 is formed in the long groove 20A by electrolytic plating. The Cu interconnection 6 is formed by soaking the wafer 1 in a plating solution to fix the feeder layer 13 as a negative (−) electrode, and a Cu film having a thickness of about 3 $\mu$m to 10 $\mu$m is deposited on the surface of the feeder layer 13 on the bottom of the long groove 20A which is not covered with the photoresist film 20.

Figure 16:
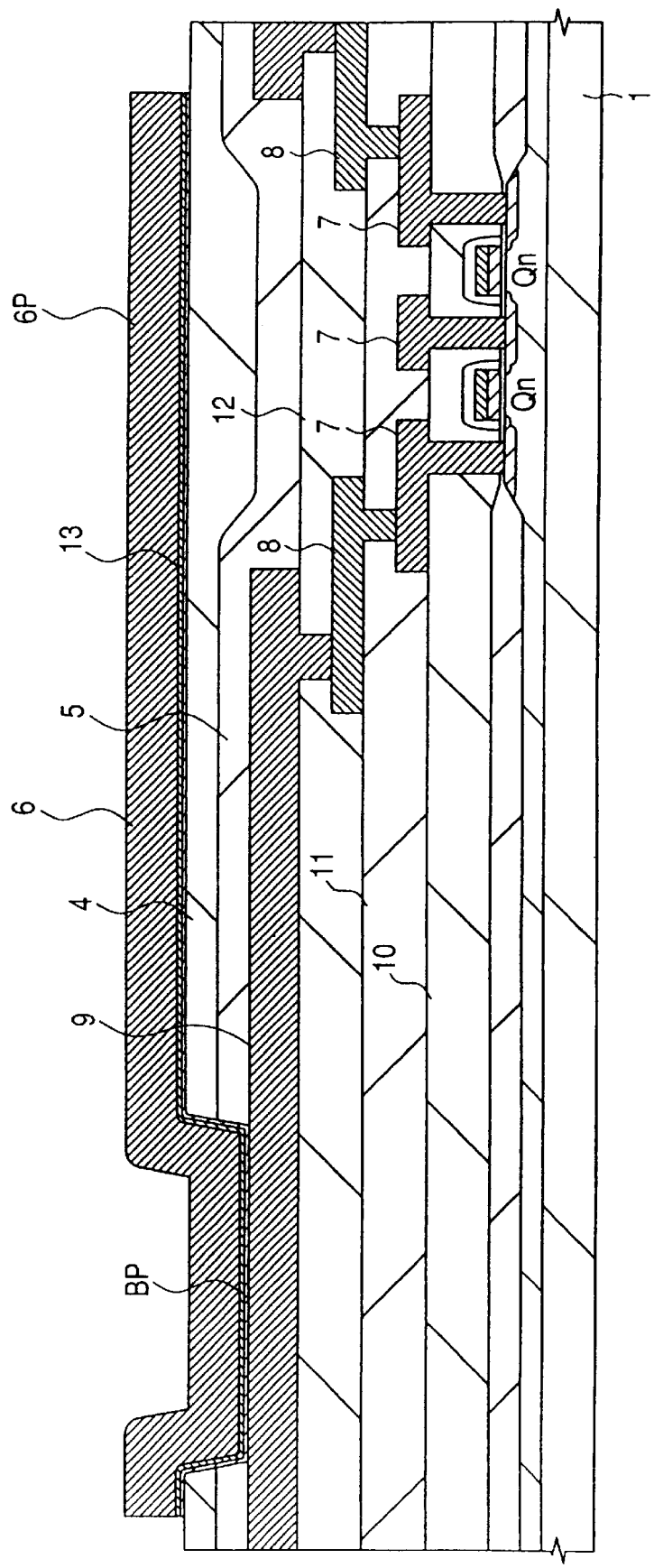
Figure 17:
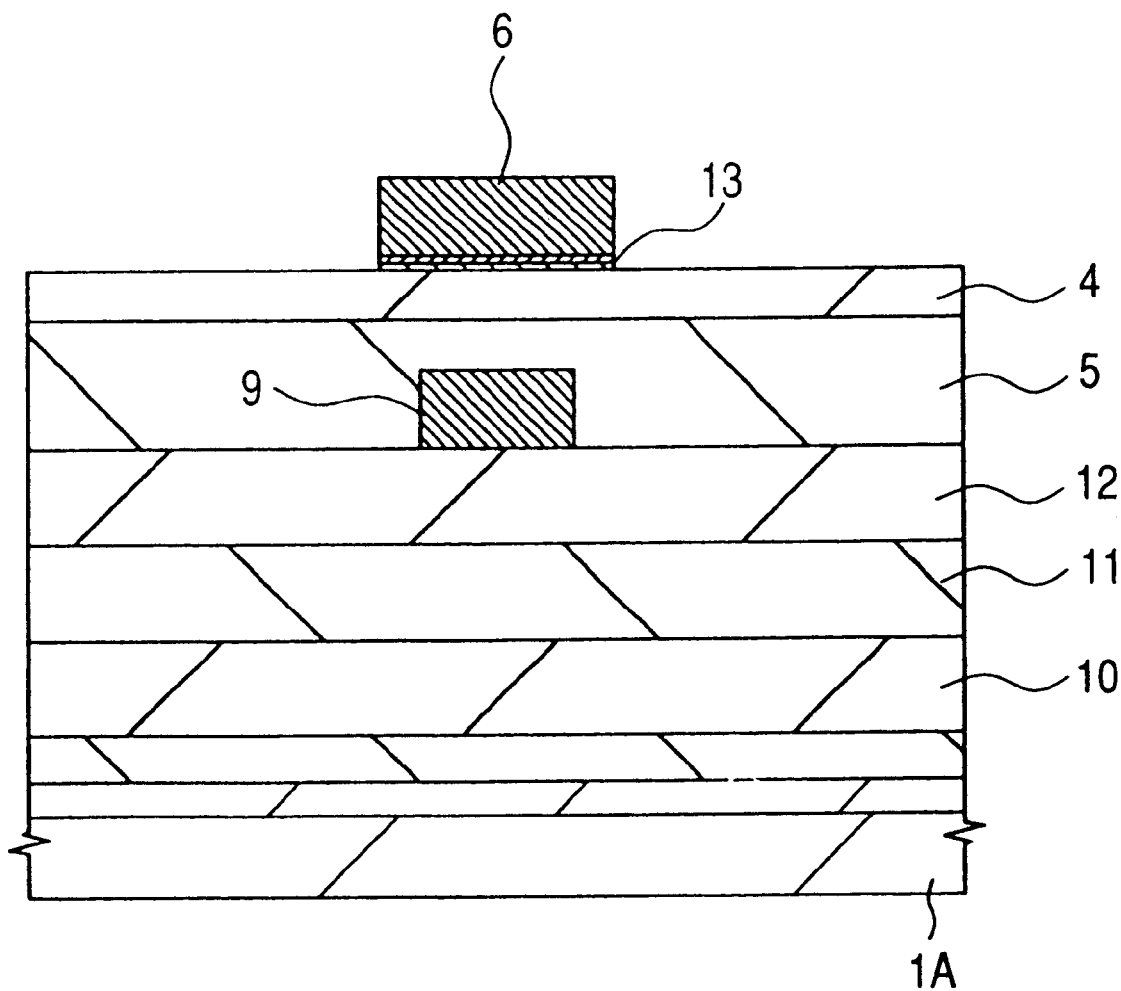

After removing the photoresist film 20, as shown in FIGS. 16 and 17, the feeder layer 13 which becomes unnecessary is removed by wet etching using the Cu interconnection 6 as a mask. After the wet etching, the feeder layer 13 remained under the Cu interconnection 6 functions as a bonding layer for increasing the bonding strength between the Cu interconnection 6 and the polyimide resin layer 4 under the feeder layer 13 and as a barrier layer for preventing diffusion of Cu into the polyimide resin layer 4.

Figure 18:
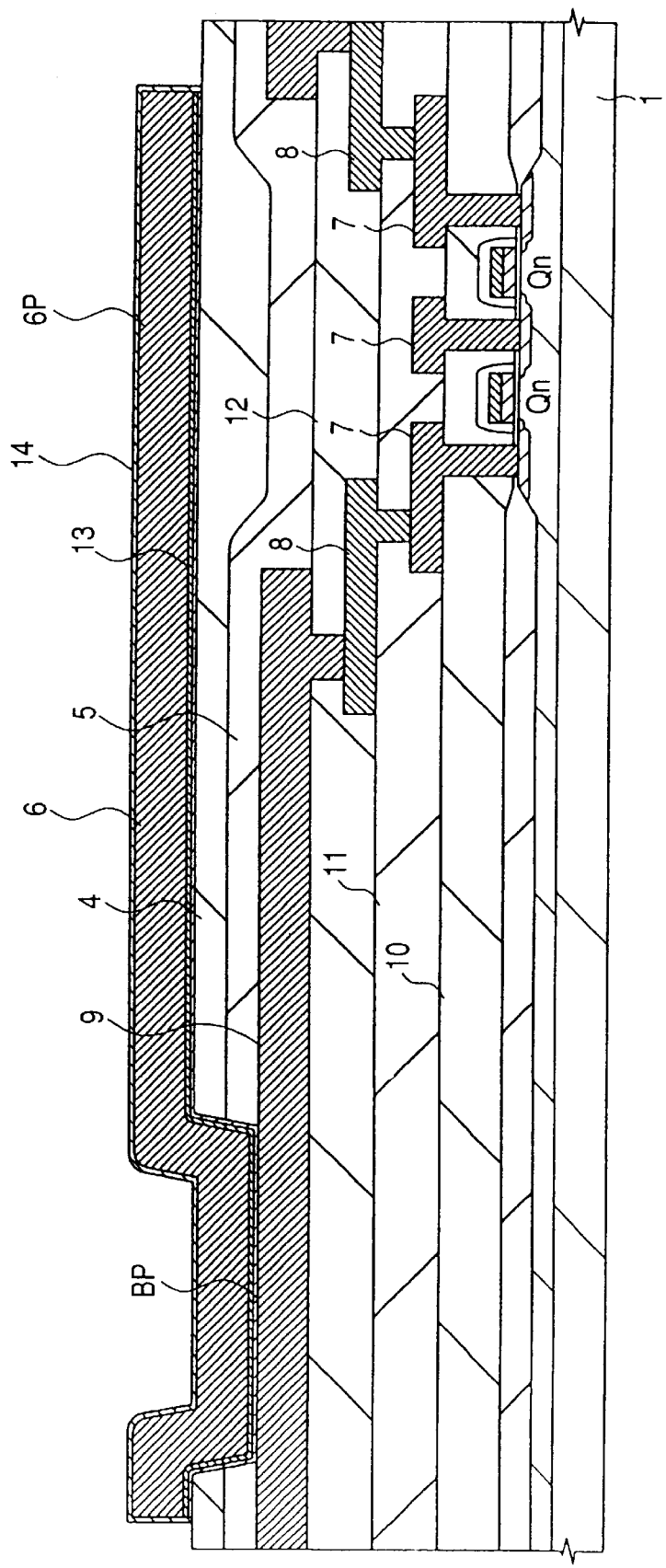
Figure 19:
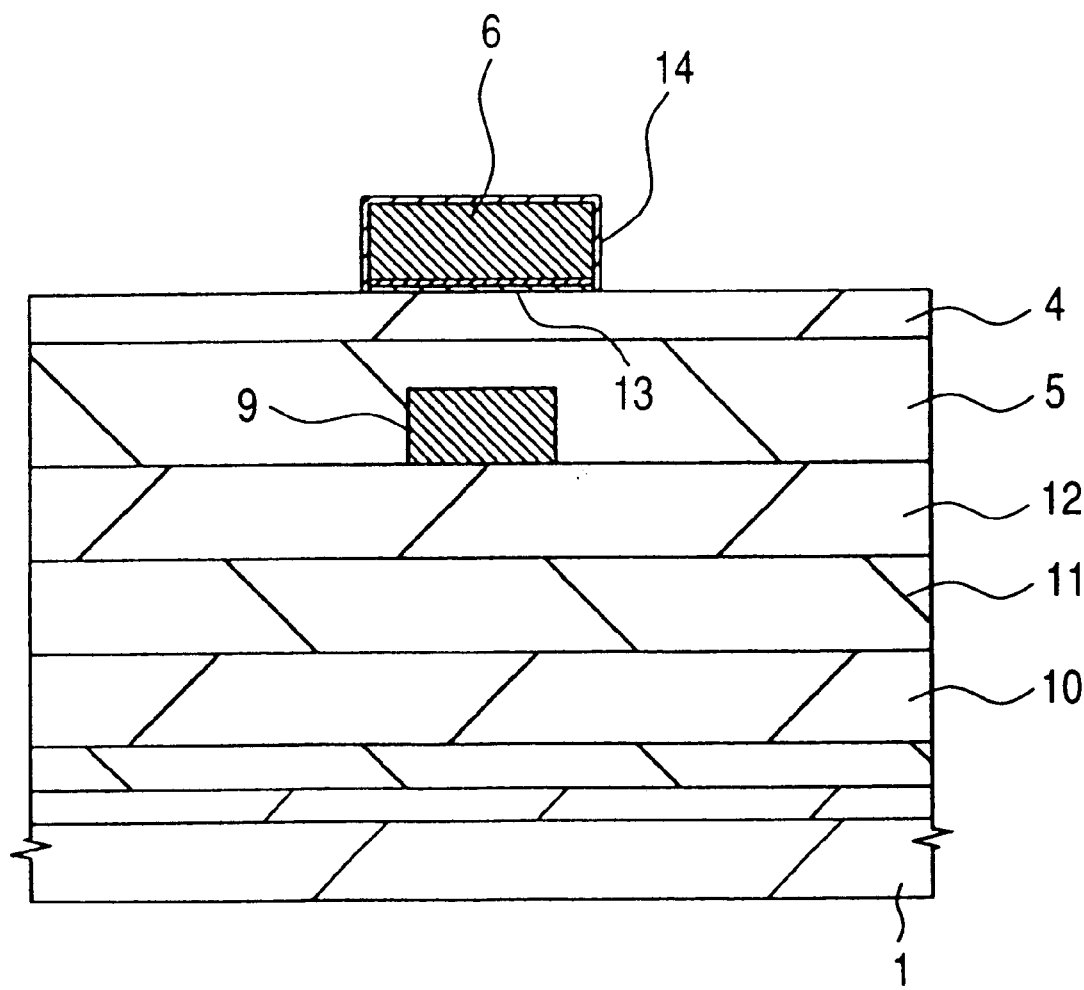

As shown in FIGS. 18 and 19, the barrier layer 14 is formed on the surface of the Cu interconnection 6 and the surface of the feeder layer 13 remained under the Cu interconnection 6. The barrier layer 14 functions as a bonding layer for increasing the bonding strength between the Cu interconnection 6 and the polyimide resin layer 3 on barrier layer 14 and as a barrier layer for preventing diffusion of Cu into the polyimide resin layer 3. The barrier layer 14 is formed by soaking the wafer 1 in an electroless plating solution, and an Ni film having a thickness of about 0.5 $\mu$m to 2 $\mu$m is deposited on the side faces of the feeder layer 13 and the side faces and the top face of the Cu interconnection 6 by a chemical reduction reaction. Since Ni functions as an effective barrier against Cu and has excellent bonding to the polyimide resin, it is a suitable material for the barrier layer 14 covering the surface of the Cu interconnection 6. The barrier layer 14 may be formed by using a material having similar properties such as Cr, Ti, TiN, Ta, TaN, and WN. The electroless plating has an advantage such that the barrier layer 14 can be formed at a high throughput since a batch process is easier as compared with the electrolytic plating. The apparatus cost of the electroless plating is lower than that of the electrolytic plating, so that the electroless plating has an advantage such that the barrier layer 14 is formed at low cost.

Figure 20:
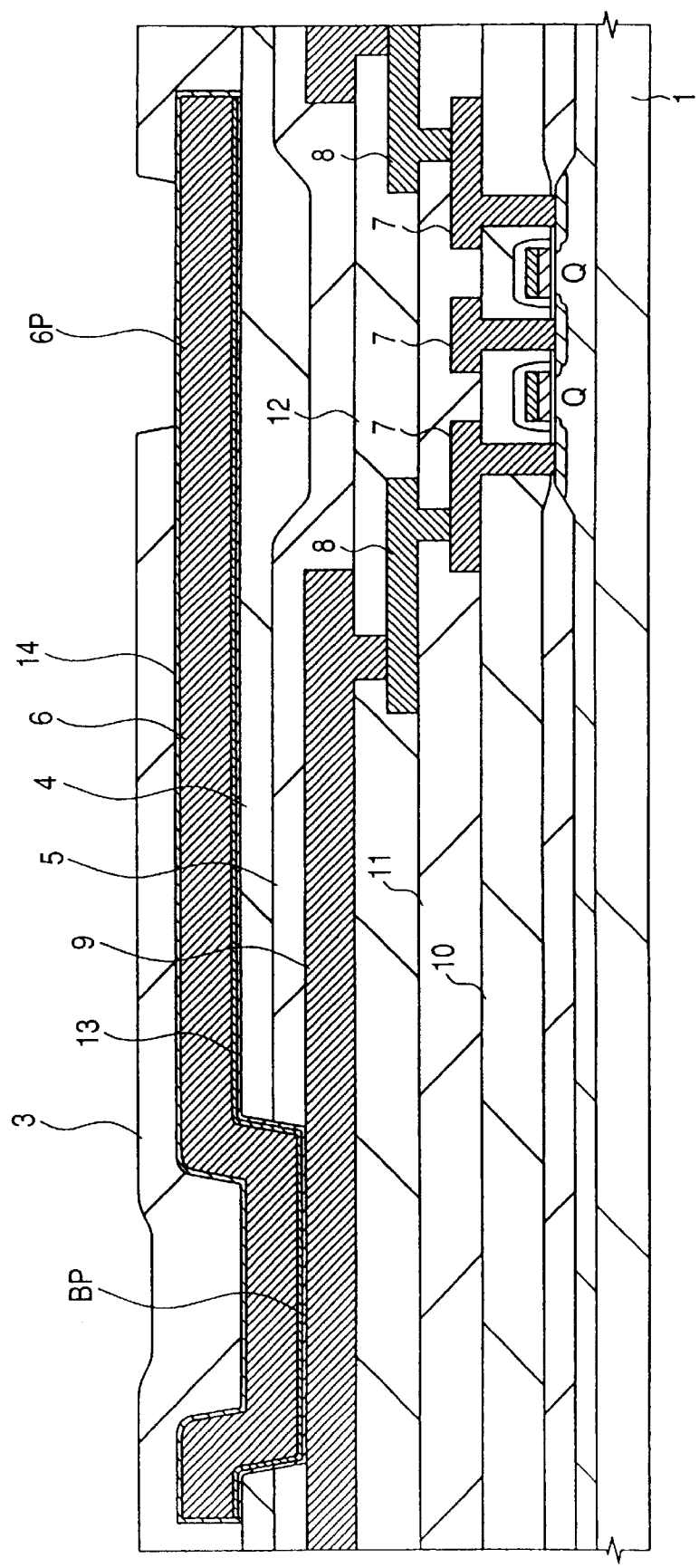
Figure 21:
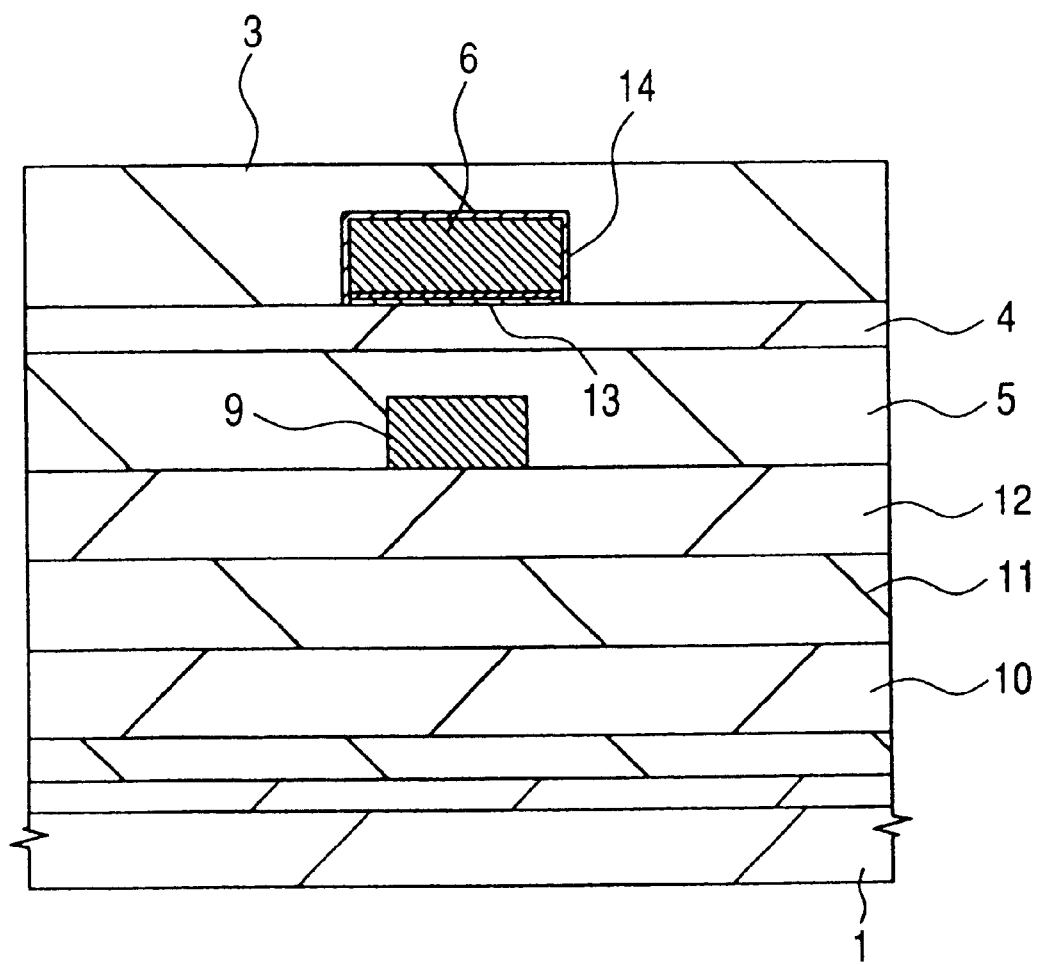

As shown in FIGS. 20 and 21, by forming the polyimide resin layer 3 in which the bump electrode connection region is opened on the Cu interconnection 6, the pad 6P is formed. The polyimide resin layer 3 is formed in a manner similar to the polyimide resin layer 4. Specifically, a photosensitive polyimide resin layer having a thickness of about 5 to 15 $\mu$m is spin-coated on the Cu interconnection 6, and heat treatment (pre-baking) at 120° C. for about 30 seconds is conducted to volatilize the solvent in the polyimide resin film. The polyimide resin film is exposed and developed to open the bump electrode connection region and, after that, heat treatment (post-baking) at 350° C. to 400° C. for about three hours is conducted to cure the polyimide resin layer. Since the barrier layer 14 has been formed on the surface of the Cu interconnection 6 covered with the polyimide resin film, even when the high-temperature heat treatment for long time as described above is performed, Cu is prevented from being diffused into the polyimide resin layer 3. Consequently, also in the area where a plurality of Cu interconnections 6 are disposed at high density at extremely narrow intervals as shown in FIG. 3, a short circuit between the Cu interconnections 6 and 6 caused by the diffusion of Cu can be effectively prevented. By making the polyimide resin layer 3 of a photosensitive polyimide resin, the process can be shortened as compared with the case of forming the polyimide resin layer 3 of a non-photosensitive polyimide resin.

Figure 22:
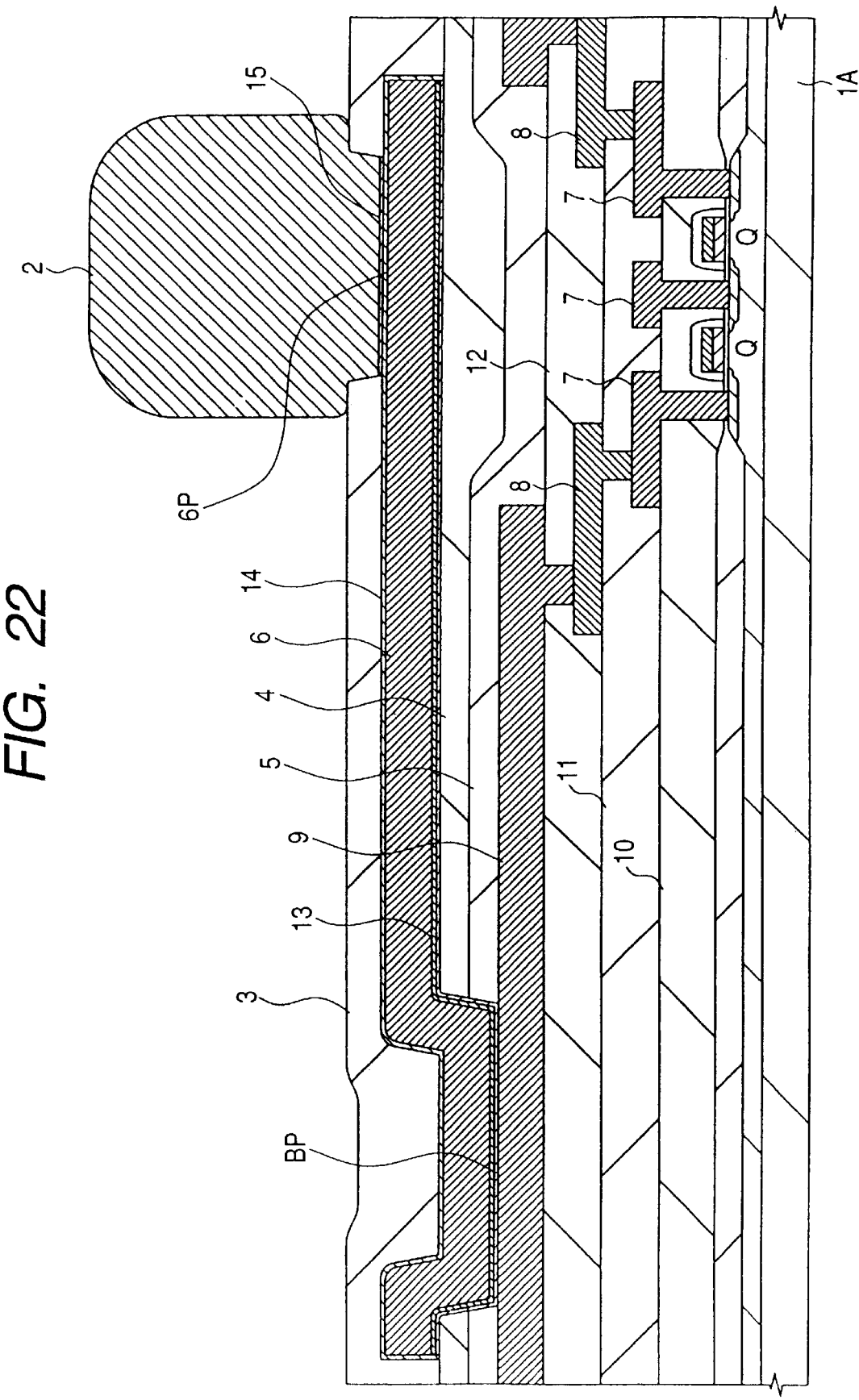

As shown in FIG. 22, the metal underlayer 15 is formed by depositing an Au film having a thickness of about 0.1 $\mu$m to 2 $\mu$m on the surface of the Cu interconnection 6 (actually, the surface of the barrier layer 14) exposed in the opening of the polyimide resin layer 3 by electroless plating. After that, the bump electrode 2 formed by using a solder made of the Sn/Pb alloy is connected onto the metal underlayer 15. The bump electrode 2 is formed by, for example, screen printing. The bump electrode 2 may be made of a solder material such as Sn or an Sn/Ag alloy.

Figure 23:
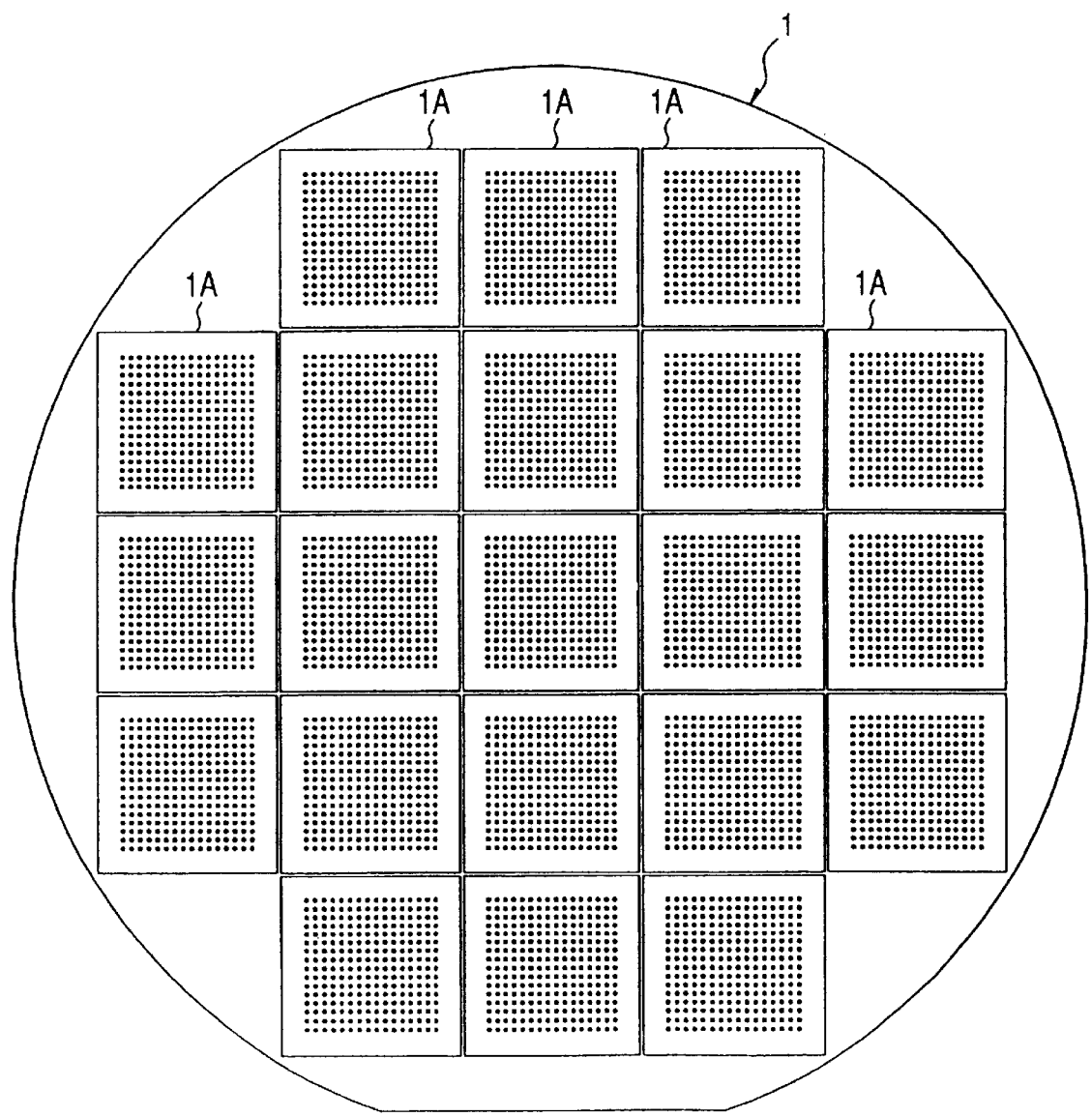
FIG. 23 is a general plan view of a wafer showing the method of manufacturing the semiconductor device as the first embodiment of the invention.

FIG. 23 is a general plan view of the wafer 1 to which the connection of the bump electrodes 2 has been completed. The wafer 1 is diced into a plurality of chips 1A, thereby completing the CSP of the embodiment shown in FIGS. 1 to 6.

Figure 24:
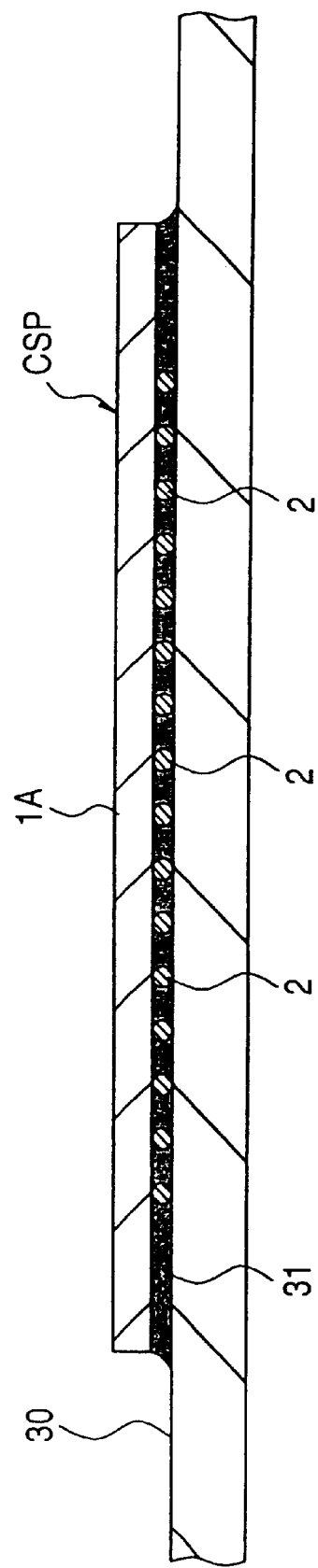
FIG. 24 is a cross section showing a state where the semiconductor device as the first embodiment of the invention is mounted on a mother board.

FIG. 24 is a cross section showing a state where the CSP of the embodiment is mounted on a mother board 30. The CSP is mounted by bonding the chip 1A facing down on the mother board 30, the bump electrodes 2 are subjected to reflow by being heated and, after that, a gap between the chip 1A and the mother board 30 is filled with an underfilling resin 31.

At the time of performing the reflow on the bump electrodes 2, the Cu interconnection 6 and the polyimide resin layer 4 formed on the principal face of the chip 1A are also exposed to a high temperature of 200° C. or higher. However, since the barrier layer 14 is formed on the surface of the Cu interconnection 6 and the polyimide resin layer 4 once cured comes to have a closely packed molecular structure in which Cu is not easily diffused, there is no possibility that a short circuit occurs between the Cu interconnections 6, 6 by the reflow on the bump electrodes 2.

According to the embodiment as described above, even when the space between the Cu interconnections 6, 6 is reduced, a short circuit does not easily occur, so that increase in the number of pins of the CSP and reduction (shrinkage) in chip size are facilitated. Even in the case of increasing the number of pins of the CSP or reducing the chip size, the diameter of the bump electrode 2 can be increased. Consequently, a part of the stress generated by a difference between a coefficient of thermal expansion of the chip 1A and that of the mother board 30 can be absorbed by the bump electrodes 2, and the gap between the chip 1A and the mounting board 30 can be widened, so that the filling with the underfilling resin 31 is also facilitated.

Second Embodiment

Although the barrier layer of Ni covering the surface of the Cu interconnection is formed by electroless plating in the foregoing first embodiment, it can be also formed by electrolytic plating as follows. The electrolytic plating has an advantage such that a metal layer of higher purity can be formed as compared with electroless plating.

Figure 25:
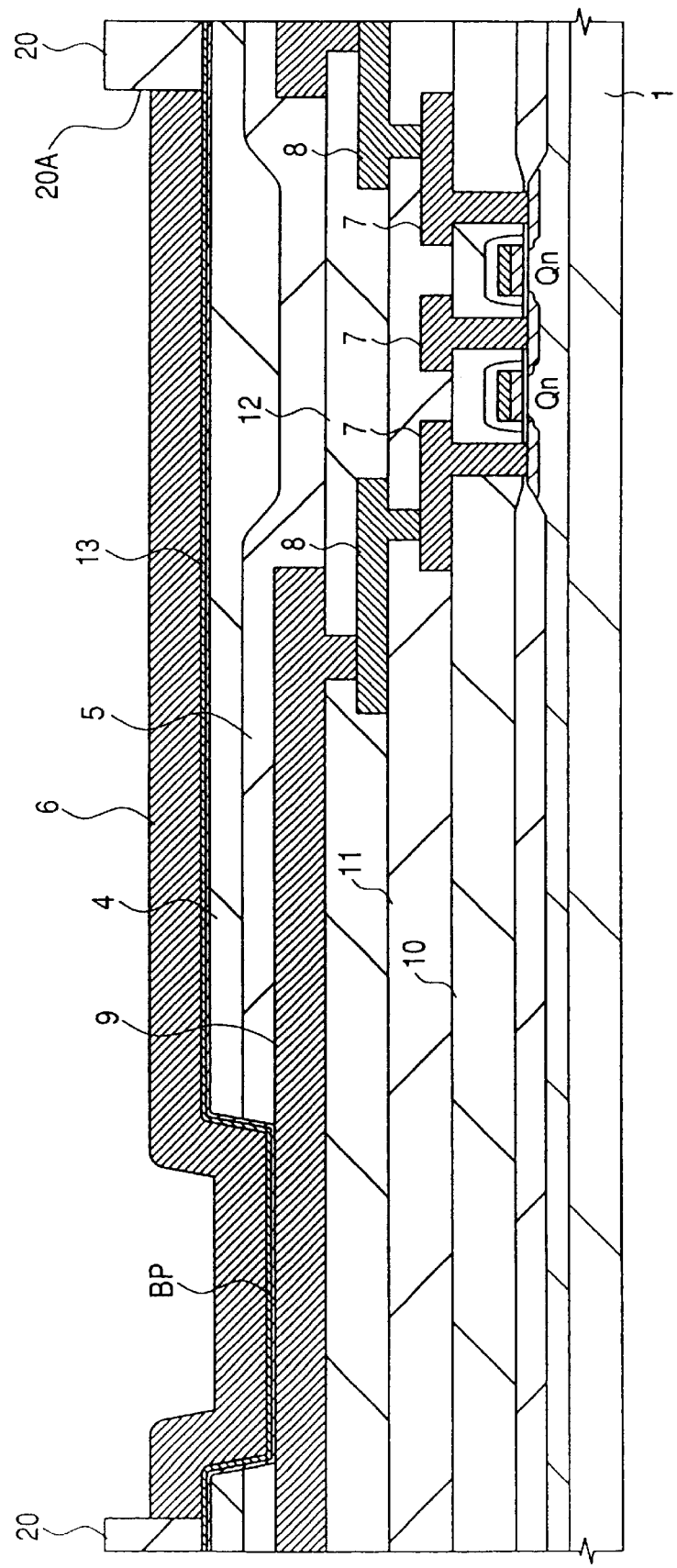
FIGS. 25 to 32 are cross sections each of a main portion of a wafer, showing a method of manufacturing a semiconductor device as a second embodiment of the invention.

First, as shown in FIG. 25, the Cu interconnection 6 is formed by electrolytic plating in the long groove 20A formed in the photoresist film 20. The process up to this step is the same as that in the first embodiment.

Figure 26:
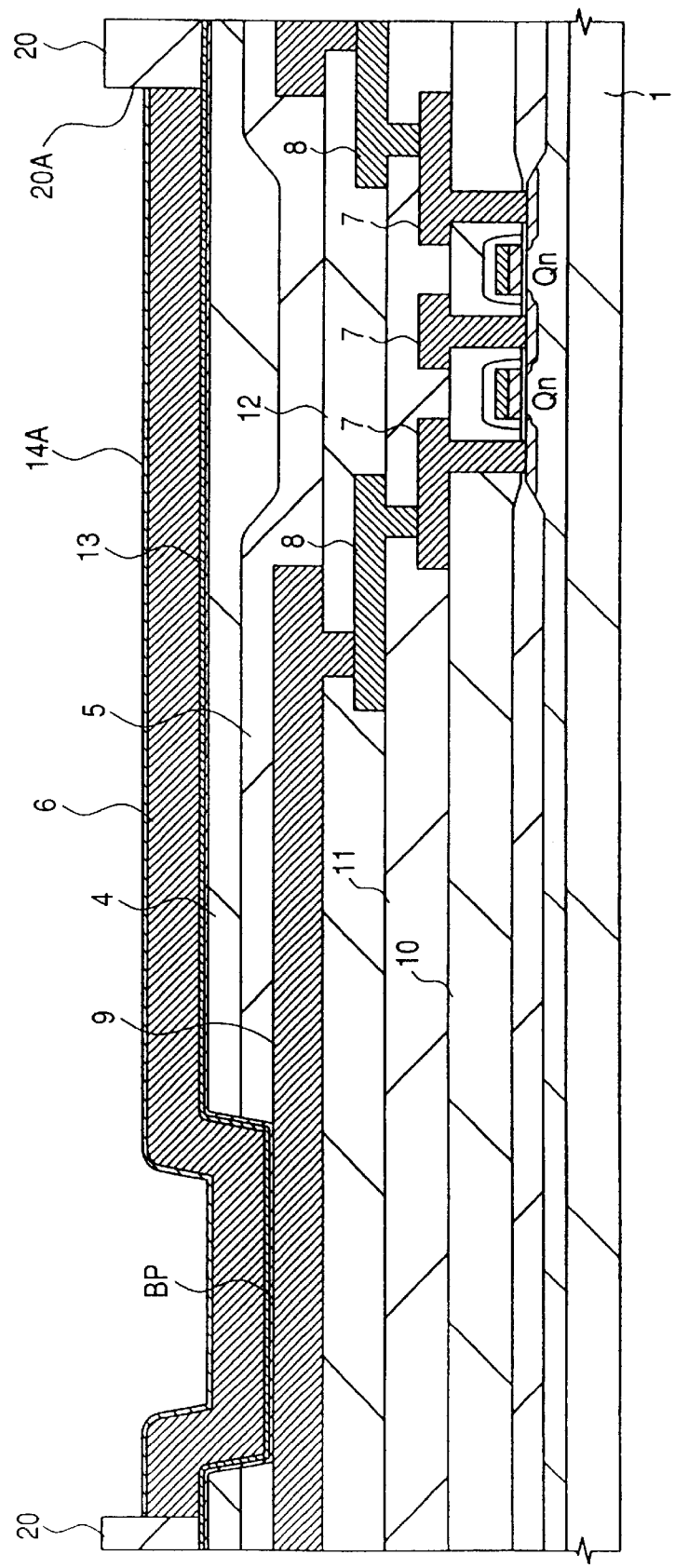

As shown in FIG. 26, by depositing an Ni film having a thickness of about 0.5 $\mu$m to 2 $\mu$m by electrolytic plating on the surface of the Cu interconnection 6 formed in the long groove 20A, a barrier layer 14A is formed. At this time, the side walls of the Cu interconnection 6 are covered with the photoresist film 20, so that the barrier layer 14A is formed only on the top face of the Cu interconnection 6.

Figure 27:
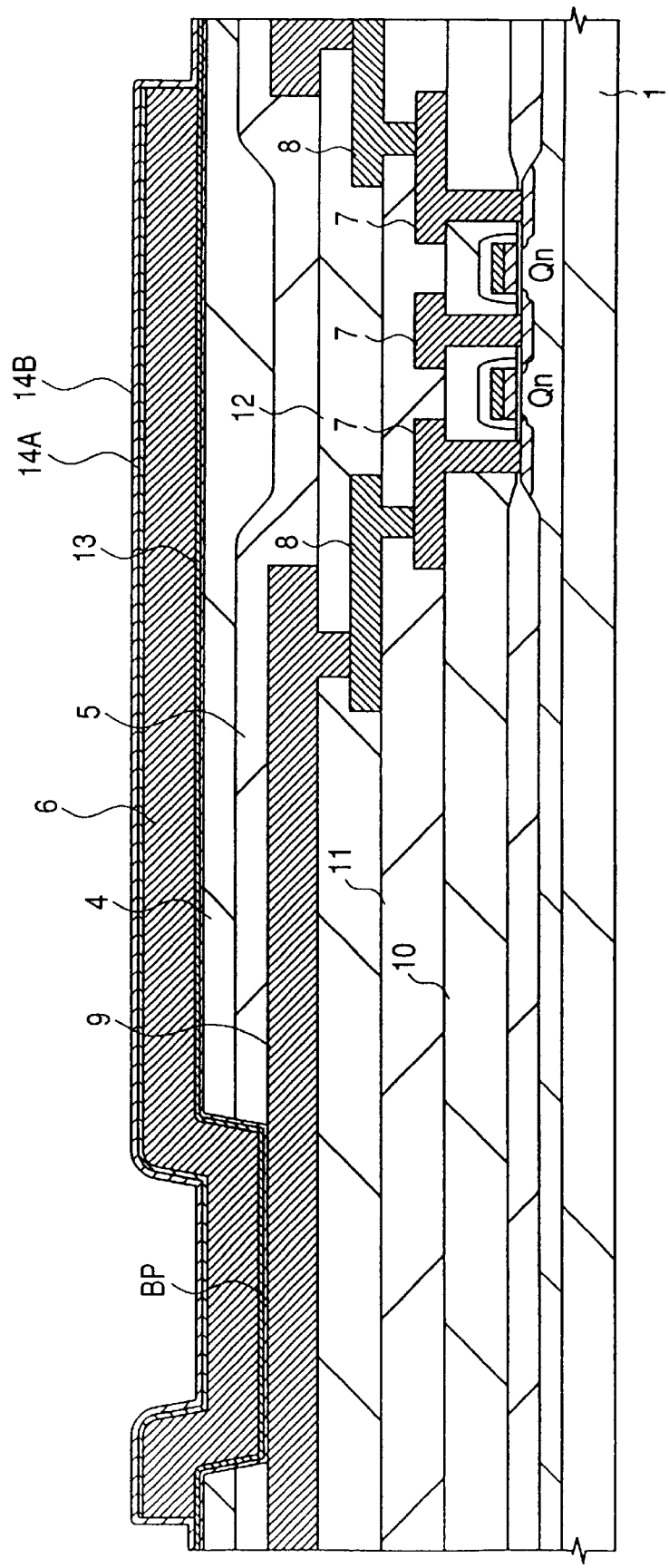
Figure 28:
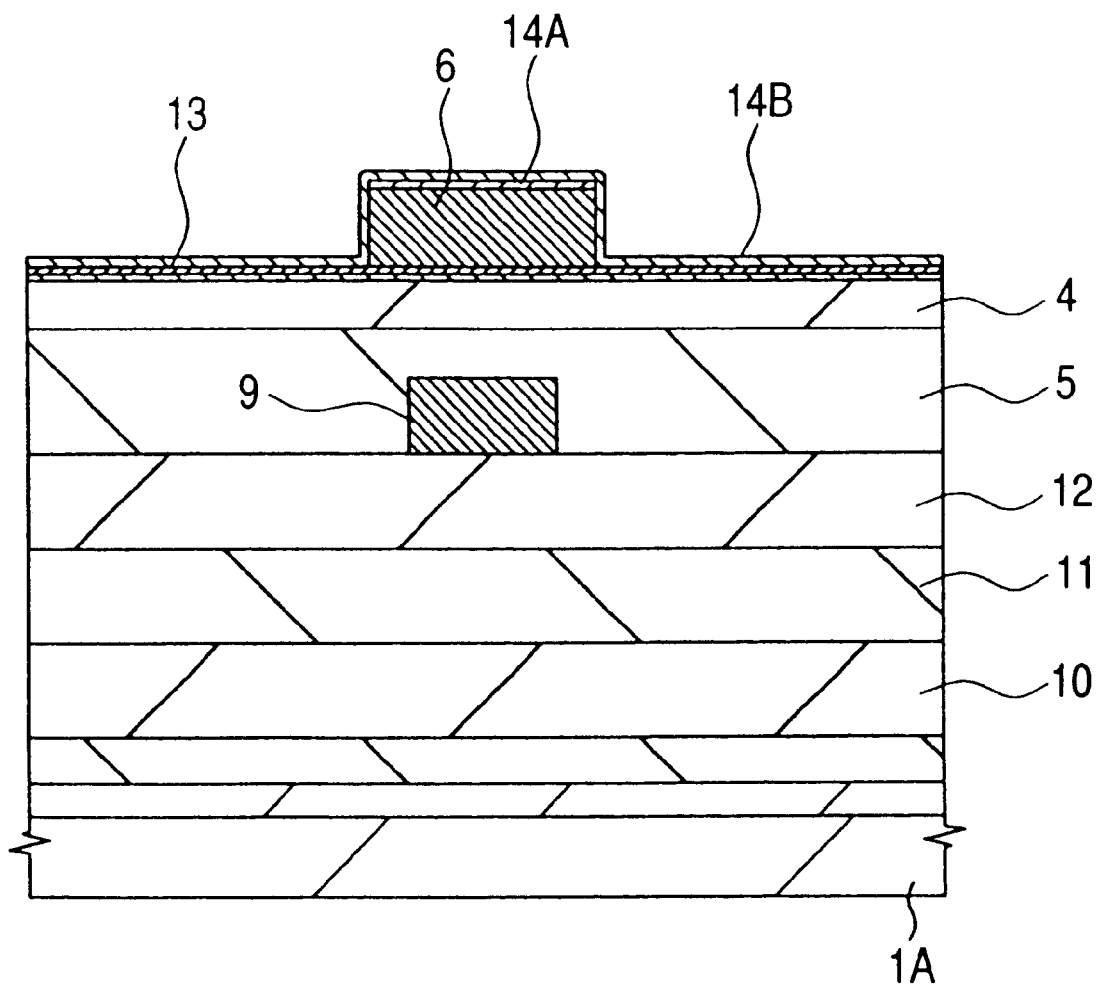

Subsequently, the photoresist film 20 is removed and, as shown in FIGS. 27 and 28, a second barrier layer 14B which is an Ni film having a thickness of about 0.5 $\mu$m to 2 $\mu$m is formed on the surface of the Cu interconnection 6 by electrolytic plating. The barrier layer 14B is formed on the whole surface of the wafer 1, that is, the top face and side walls of the Cu interconnection 6 and the surface of the feeder layer 13. Since the barrier layer 14A has been already formed on the top face of the Cu interconnection 6, the barrier layers (barrier layers 14A and 14B) formed on the top face of the Cu interconnection 6 are thicker than the other area.

Figure 29:
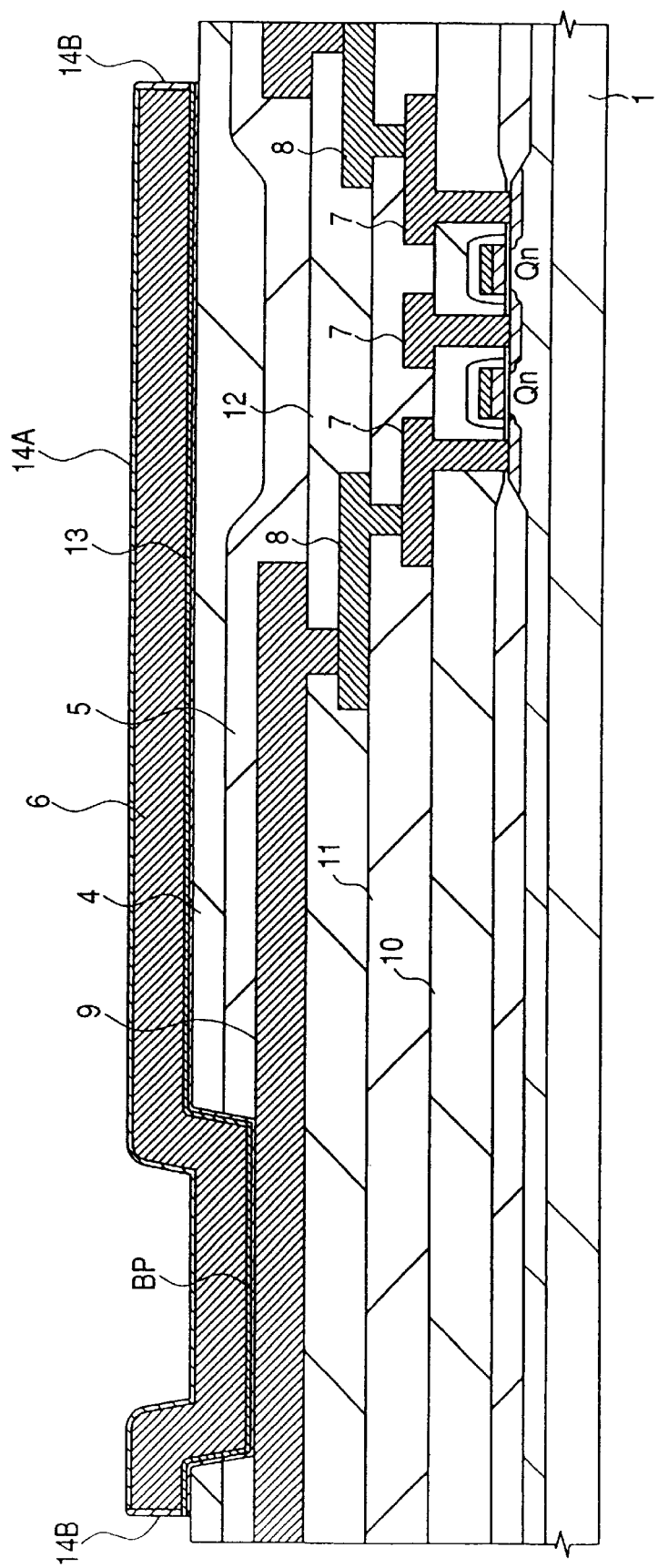
Figure 30:
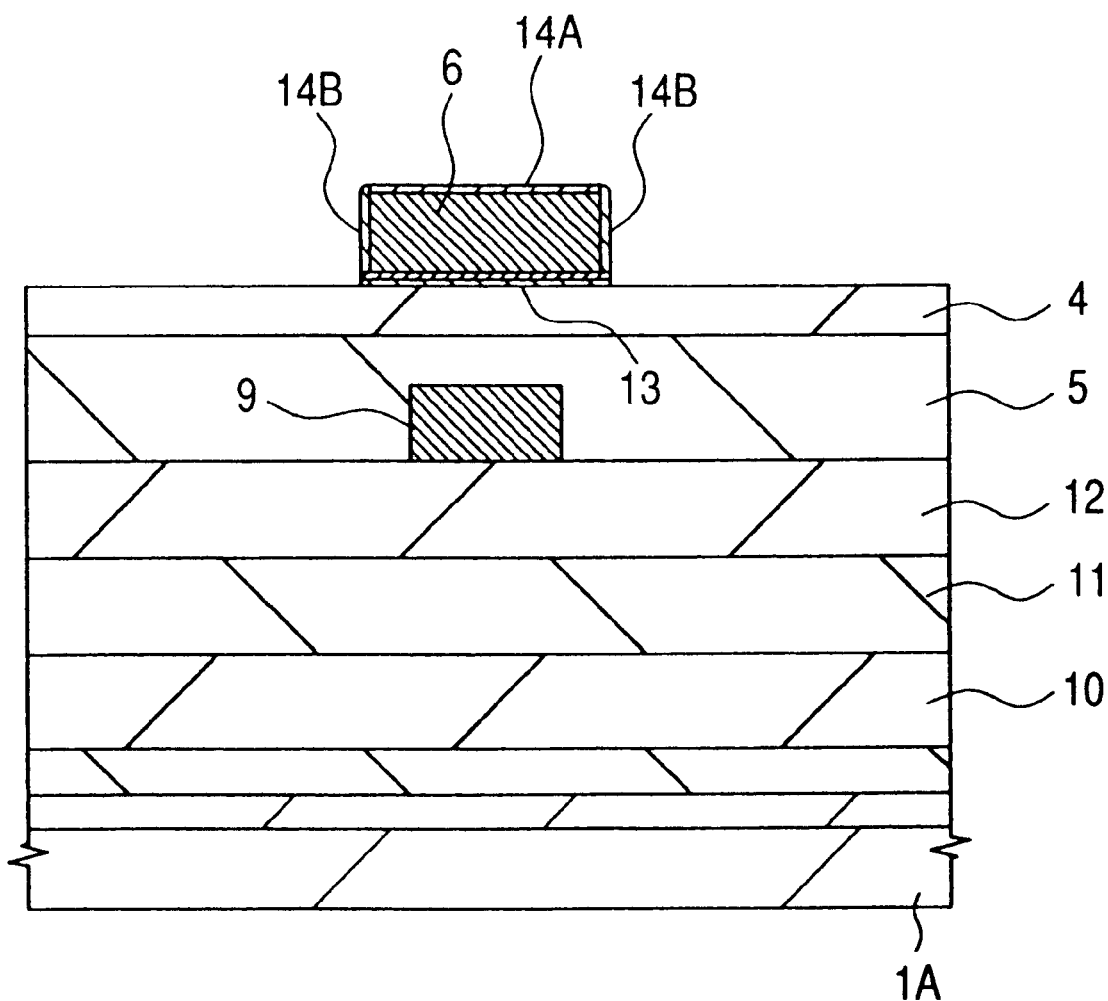

As shown in FIGS. 29 and 30, the barrier layer 14B and the feeder layer 13. are sequentially etched. In this case, the barrier layer 14B is etched anisotropically so as to be left only on the side walls of the Cu interconnection 6 (and the feeder layer 13 under the Cu interconnection 6). By the etching, the Cu interconnection 6 of which side faces are covered with the barrier layer 14B and of which top face is covered with the barrier layer 14A is obtained.

Figure 31:
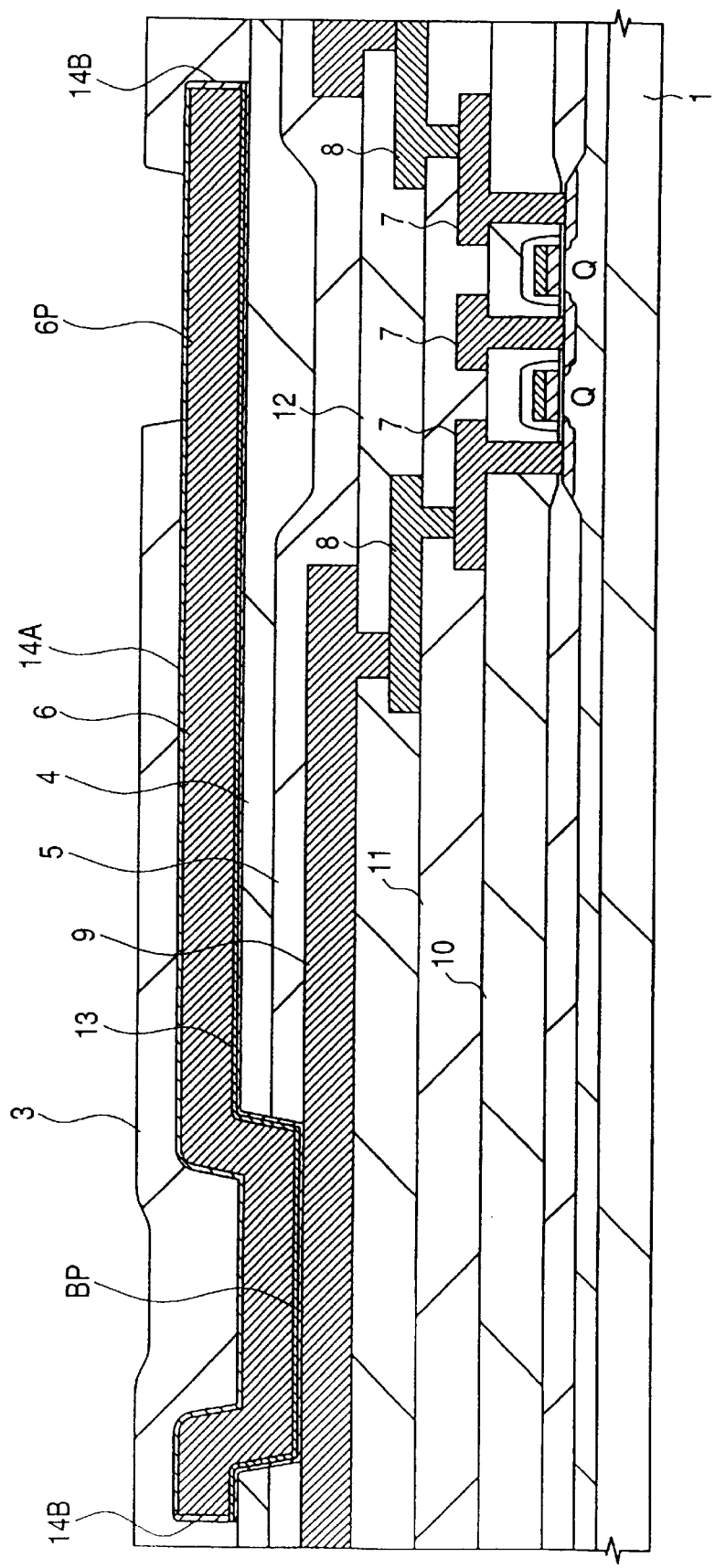
Figure 32:
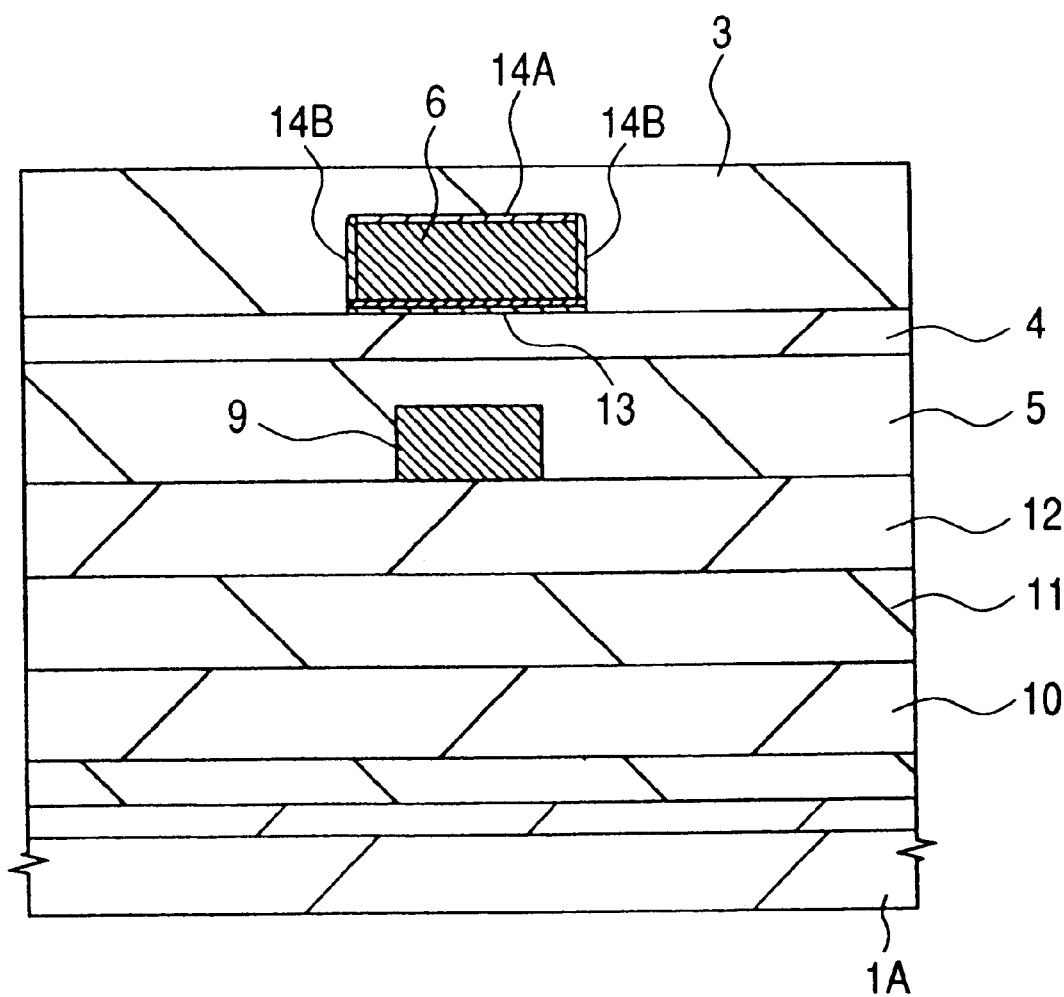

As shown in FIGS. 31 and 32, by forming the polyimide resin layer 3 in which the bump electrode connection region is opened on the Cu interconnection 6, the pad 6P is formed. The polyimide resin layer 3 is formed in a manner similar to the first embodiment. Specifically, a photosensitive polyimide resin layer having a thickness of about 5 to 15 $\mu$m is spin-coated on the Cu interconnection 6, and heat treatment (pre-baking) at 120° C. for about 30 seconds is conducted to volatilize the solvent in the polyimide resin film. The polyimide resin film is exposed and developed to open the bump electrode connection region and, after that, the polyimide resin film is cured by performing heat treatment (post-baking) at 350° C. to 400° C. for about three hours. Since the barrier layers 14A and 14B have been formed on the surface of the Cu interconnection 6 covered with the polyimide resin film, even when the high-temperature heat treatment for long time as described above is executed, Cu can be prevented from being diffused into the polyimide resin layer 3. The following process (connection of the bump electrodes 2 and dicing of the wafer 1) is the same as that of the first embodiment.

Third Embodiment

Formation of the barrier layer by electrolytic plating can be also performed by a method as follows.

Figure 33:
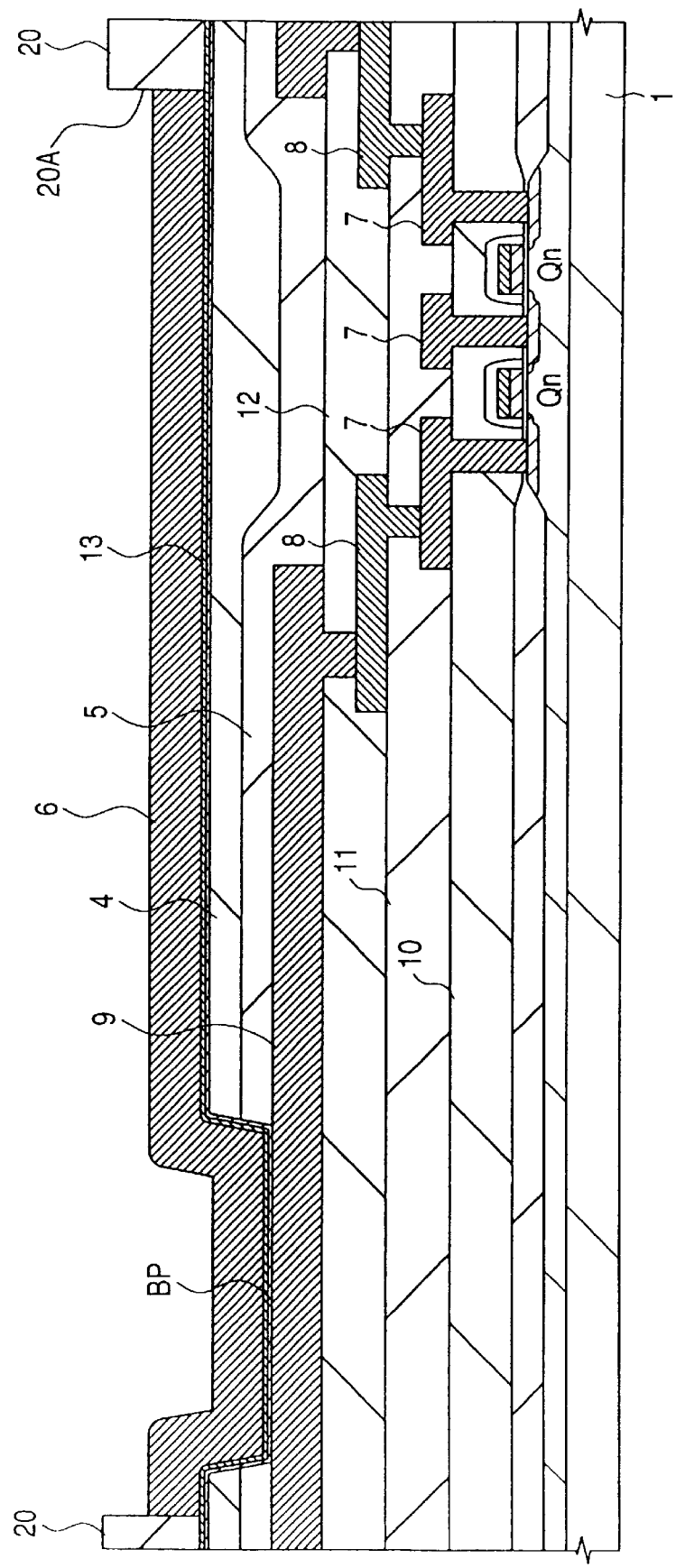
FIGS. 33 to 41 are cross sections each of a main portion of a wafers, showing a method of manufacturing a semiconductor device as a third embodiment of the invention.

First, as shown in FIG. 33, the Cu interconnection 6 is formed in the long groove 20A formed in the photoresist film 20 by electrolytic plating. The process up to here is the same as that in the first and second embodiments.

Figure 34:
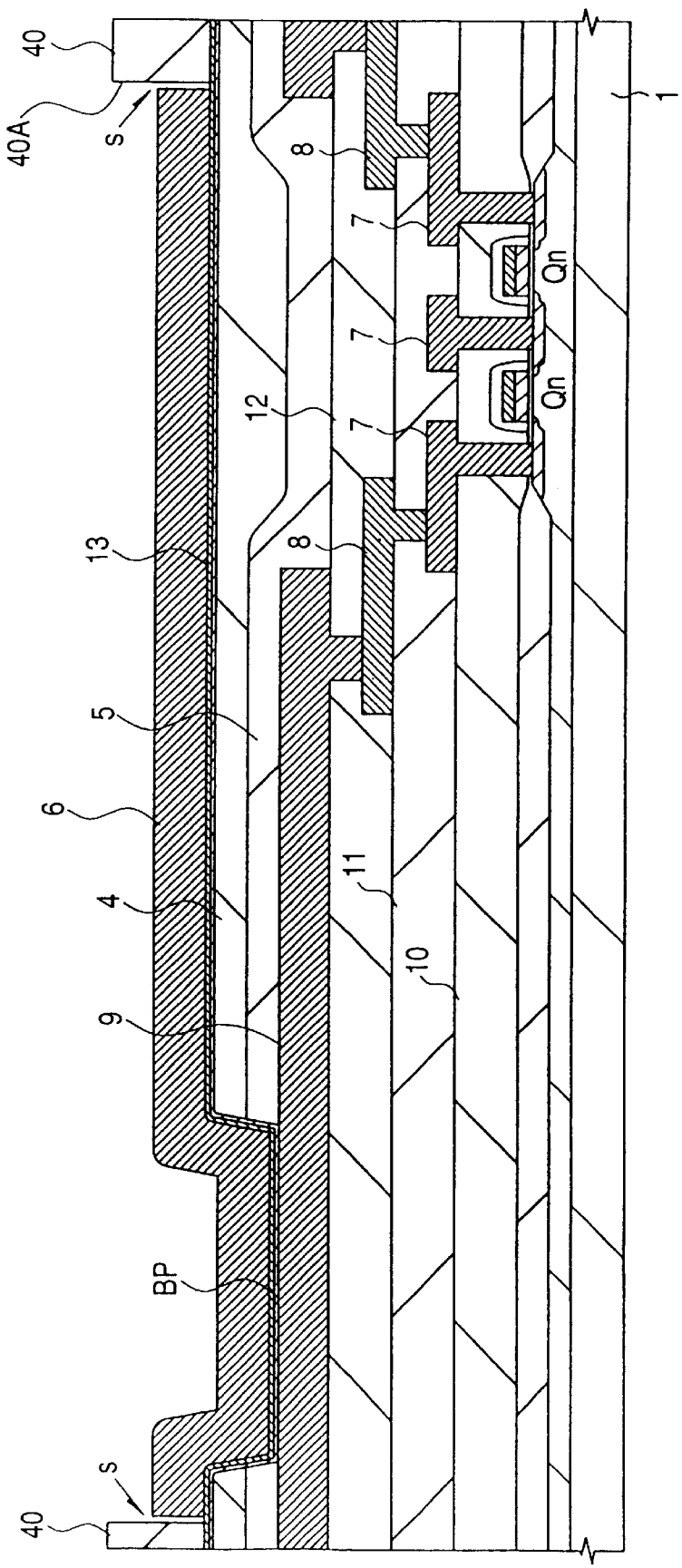
Figure 35:
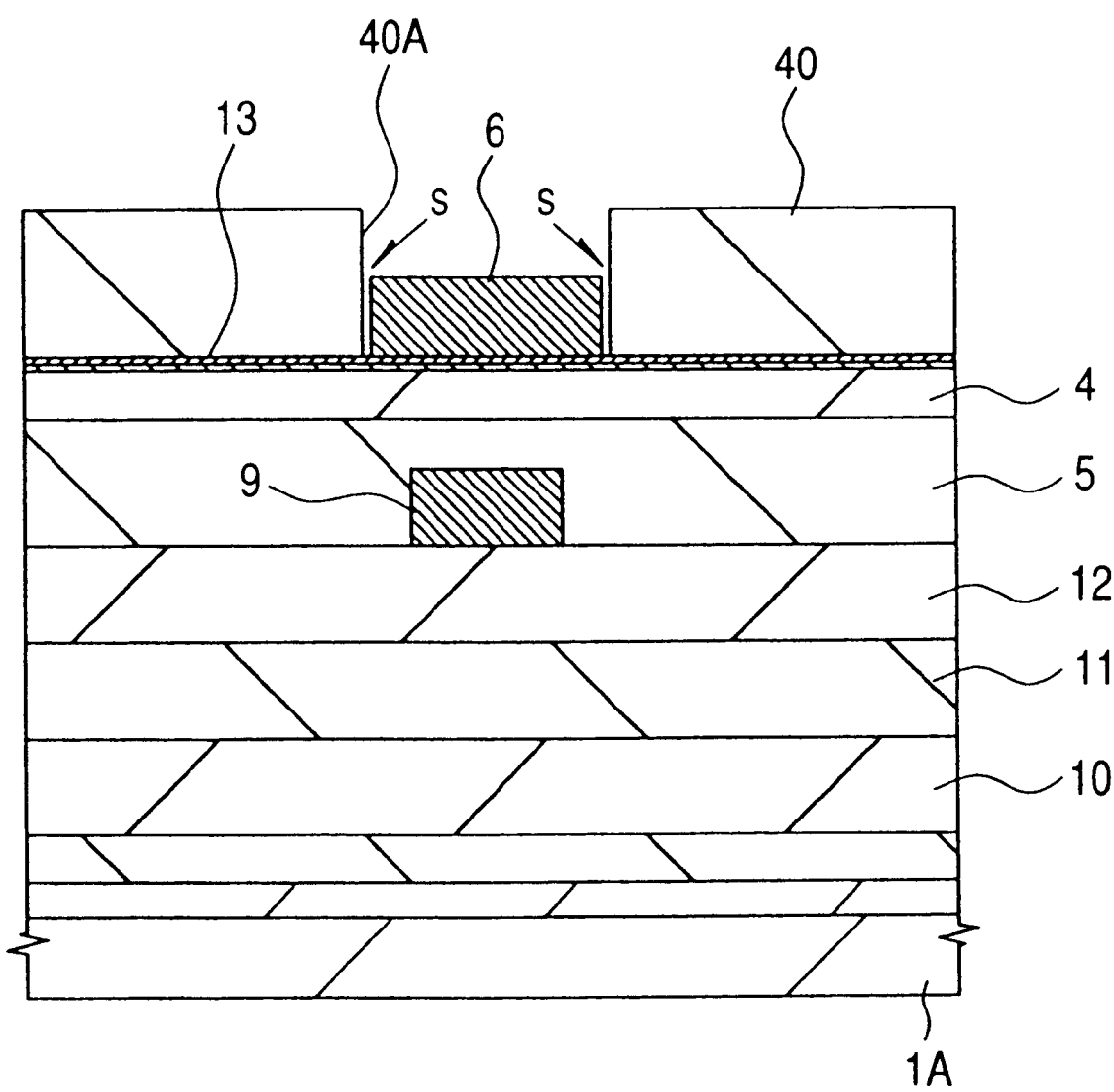

Subsequently, the photoresist film 20 is removed and, as shown in FIGS. 34 and 35, by exposing and developing a second photoresist film 40 spin-coated on the feeder layer 13 and the Cu interconnection 6, a long groove 40A having one end extending onto the bonding pad BP and the other end extending to the bump electrode connection region is formed. In this case, by making the area of the long groove 40A larger than that of the long groove 20A formed in the photoresist film 20, a gap (s) is formed between each of the side walls of the Cu interconnection 6 and each of the side walls of the long groove 40A.

Figure 36:
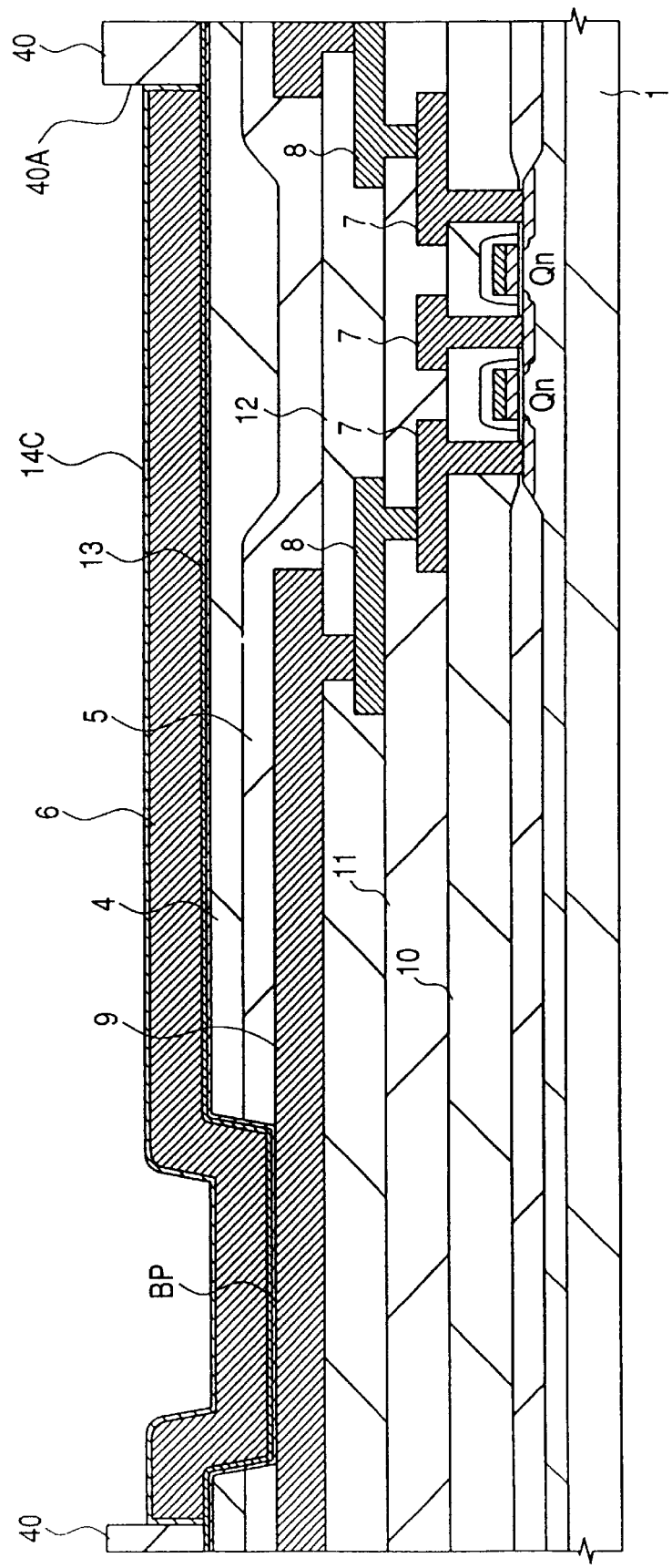
Figure 37:
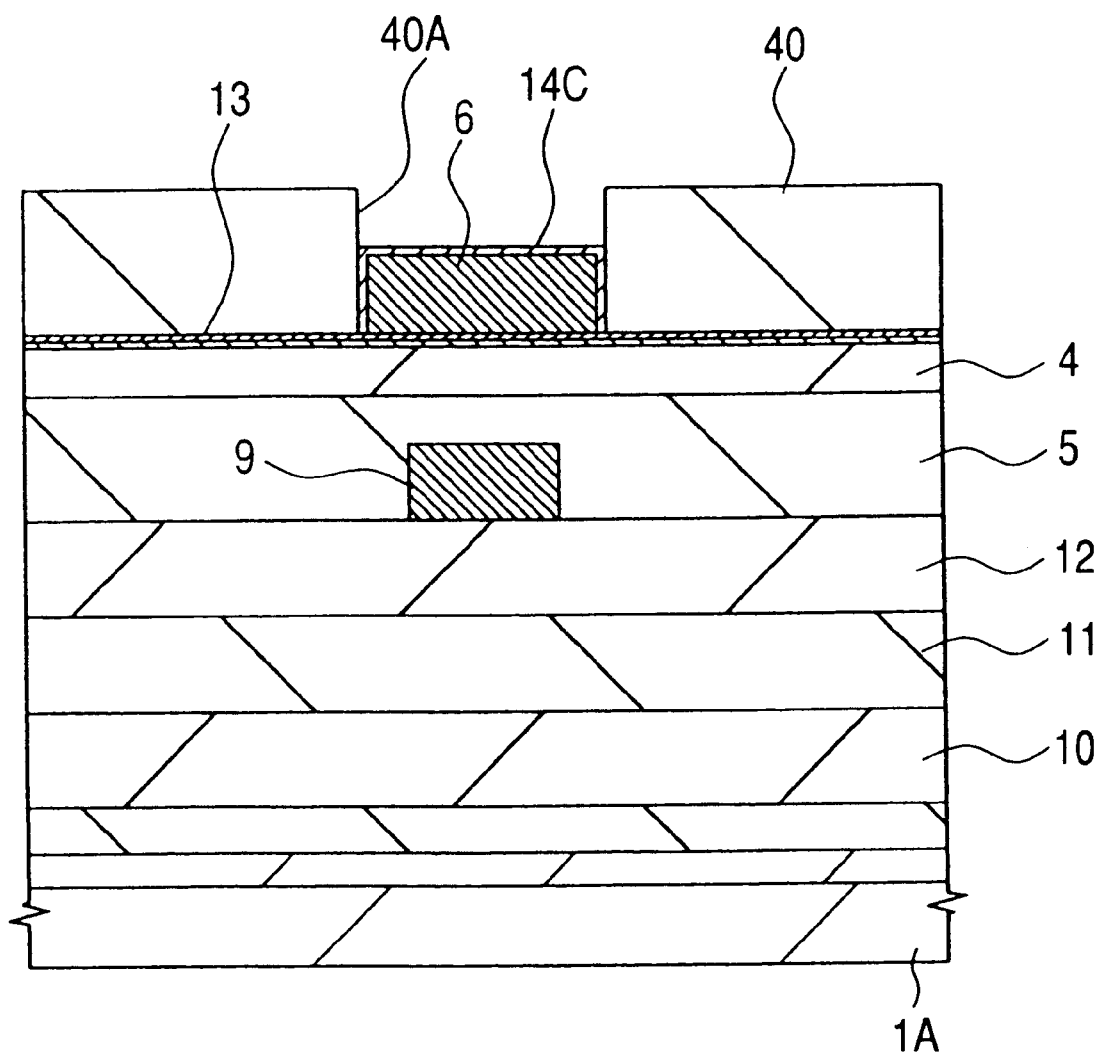

As shown in FIGS. 36 and 37, by depositing an Ni film having a thickness of about 0.5 $\mu$m to 2 $\mu$m on the surface of the Cu interconnection 6 by electrolytic plating, a barrier layer 14C is formed. As described above, since the gap (s) is created between each of the side walls of the Cu interconnection 6 and each of the side walls of the long groove 40A, the barrier layer 14C is formed on the side walls and the top face of the Cu interconnection 6.

Figure 38:
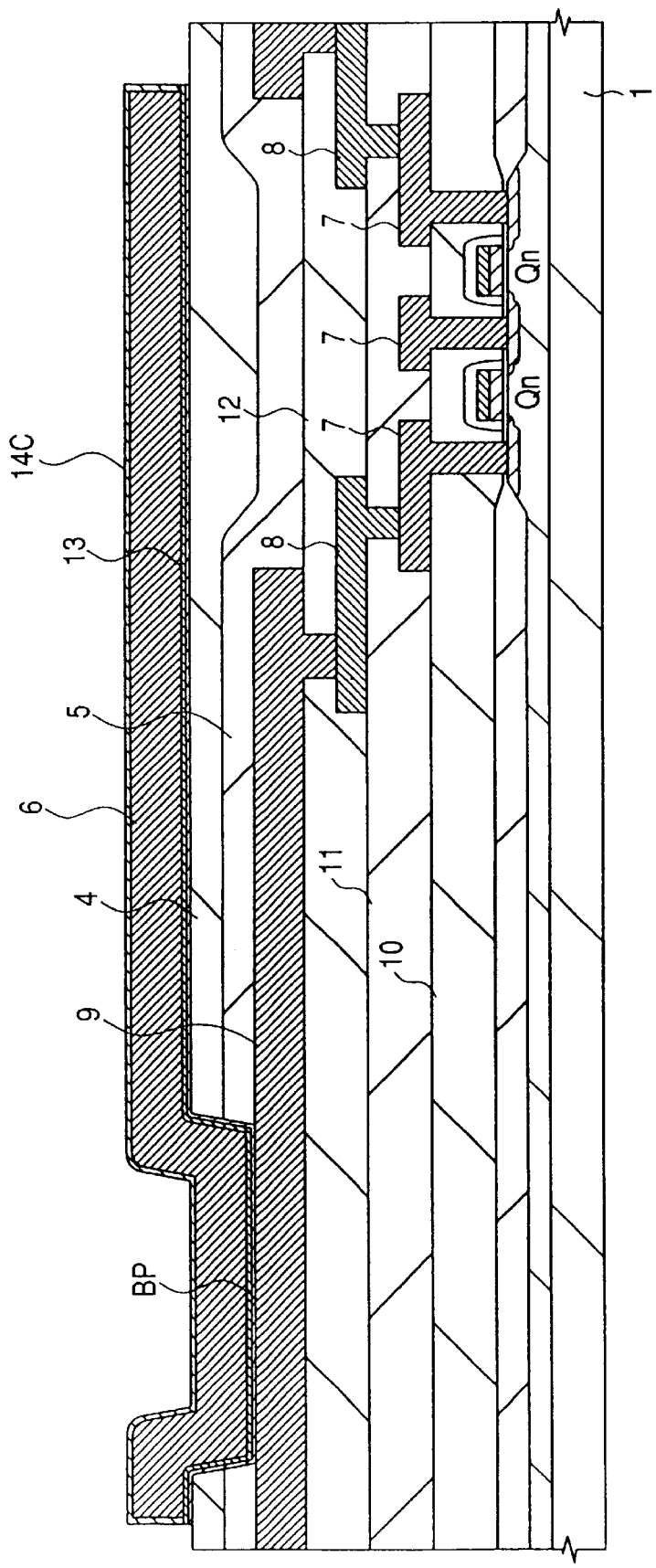
Figure 39:
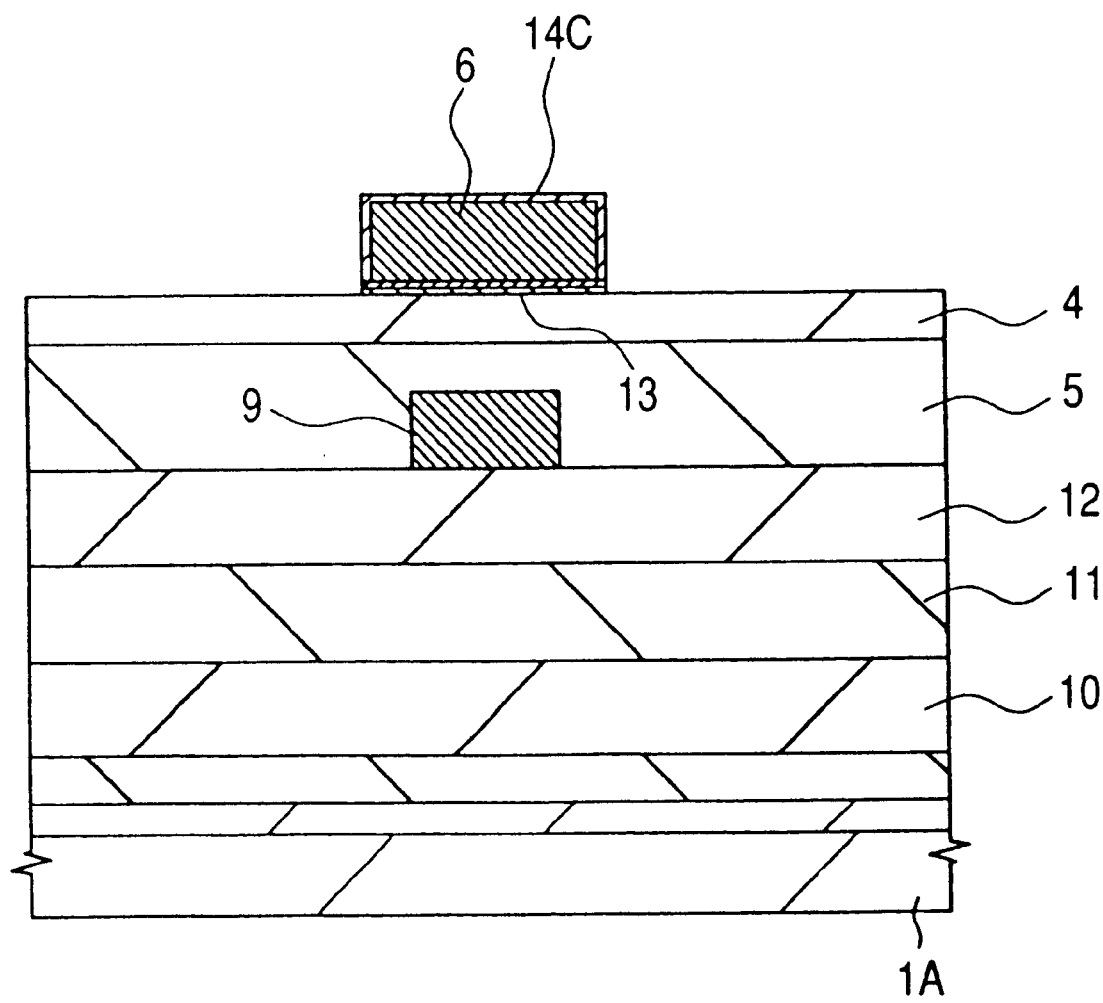

Subsequently, the photoresist film 40 is removed and, after that, as shown in FIGS. 38 and 39, the feeder layer 13 which becomes unnecessary is removed by wet etching using the Cu interconnection 6 as a mask.

Figure 40:
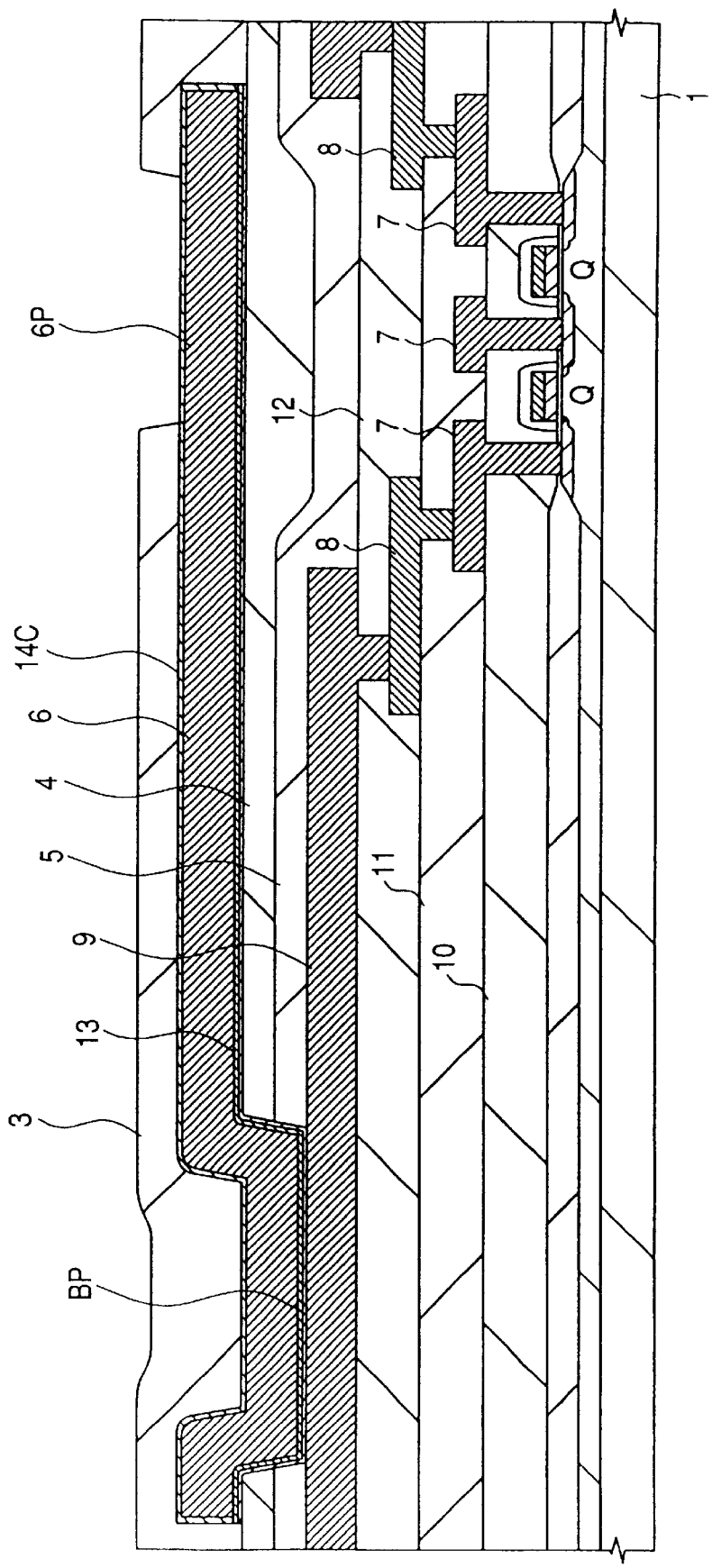
Figure 41:
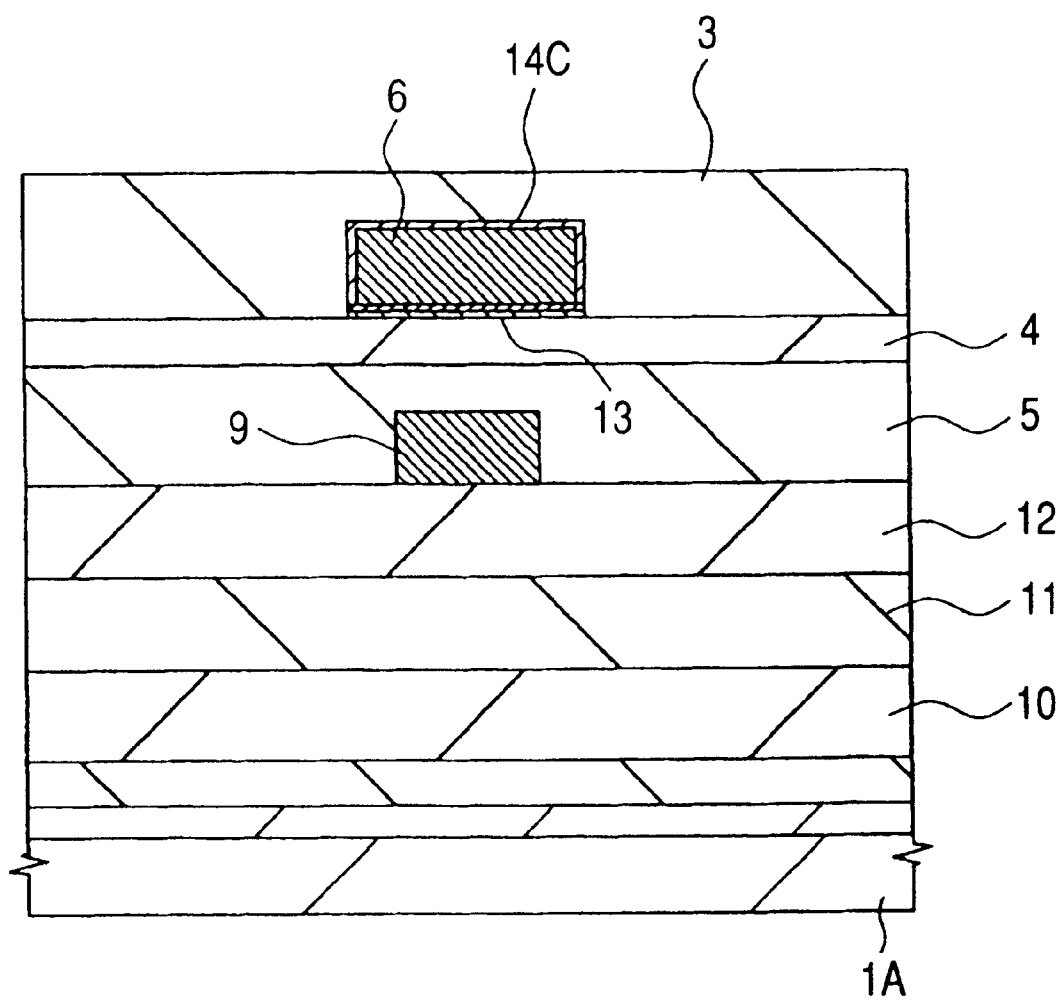

As shown in FIGS. 40 and 41, by forming the polyimide resin layer 3 in which the bump electrode connection region is opened on the Cu interconnection 6, the pad 6P is formed. The polyimide resin layer 3 is formed in a manner similar to the first embodiment. Specifically, a photosensitive polyimide resin layer having a thickness of about 5 to 15 $\mu$m is spin-coated on the Cu interconnection 6, and heat treatment (pre-baking) at 120° C. for about 30 seconds is conducted to volatilize the solvent in the polyimide resin film. The polyimide resin film is exposed and developed to open the bump electrode connection region and, after that, the polyimide resin layer is cured by performing heat treatment (post-baking) at 350° C. to 400° C. for about three hours. Since the barrier layers 14A and 14B have been formed on the surface of the Cu interconnection 6 covered with the polyimide resin film, even when the high-temperature heat treatment for long time as described above is executed, Cu can be prevented from being diffused into the polyimide resin layer 3. The following process (connection of the bump electrodes 2 and dicing of the wafer 1) is the same as that of the first embodiment.

In the method of forming the barrier layer 14C according to the embodiment, a process of anisotropically etching the barrier layer 14B as in the second embodiment is unnecessary.

Fourth Embodiment

In the first to third embodiments, as the barrier layer covering the surface of the Cu interconnection, a metal film made of Ni or the like is used. As the barrier layer, an insulating film can be also used as follows. Also, in the first to third embodiments, the polyimide resin layer on the Cu interconnection is made of a photosensitive polyimide resin. It can be also made of a non-photosensitive polyimide resin as follows.

Figure 42:
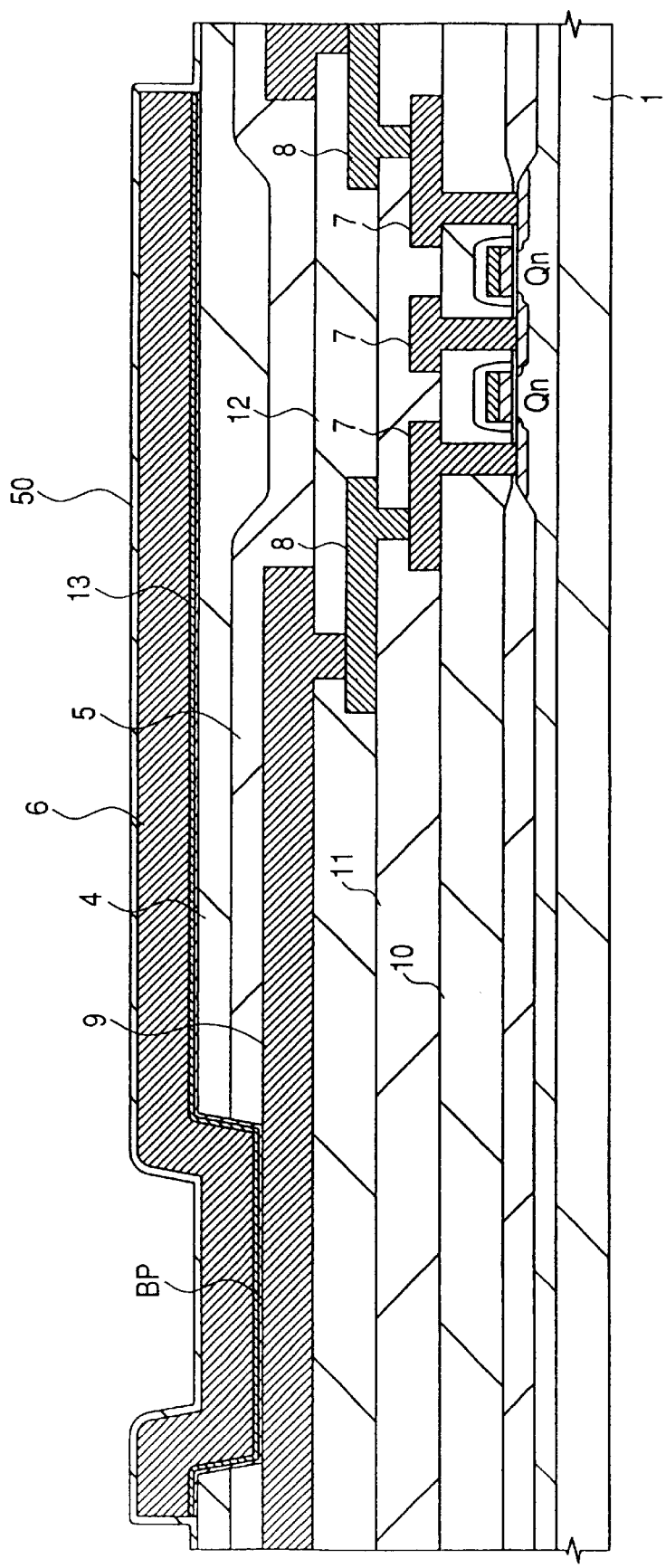
FIGS. 42 to 48 are cross sections each of a main portion of a wafer, showing a method of manufacturing the semiconductor device as the third embodiment of the invention.
Figure 43:
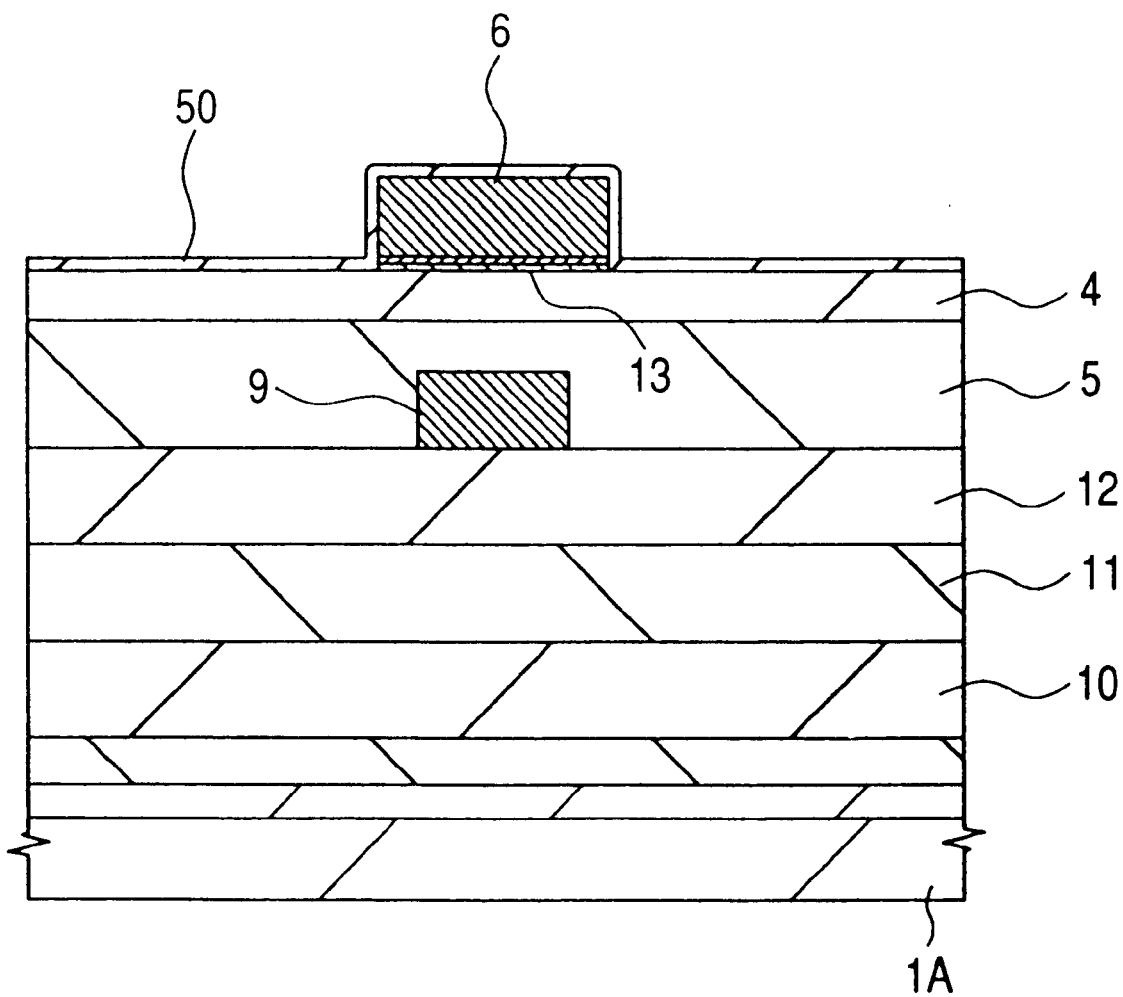

First, the Cu interconnection 6 is formed on the polyimide resin layer 4 in accordance with the steps shown in FIGS. 7 to 17 of the first embodiment, and the feeder layer 13 which becomes unnecessary is removed by etching using the Cu interconnection 6 as a mask. After that, as shown in FIGS. 42 and 43, an insulating film 50 having a thickness of about 1 $\mu$m to 5 $\mu$m is formed on the polyimide resin layer 4 and also the Cu interconnection 6. As the insulating film 50 covering the Cu interconnection 6, a closely packed film which does not easily transmit Cu, for example, a silicon nitride film or a silicon oxynitride film deposited by plasma CVD is used.

Figure 44:
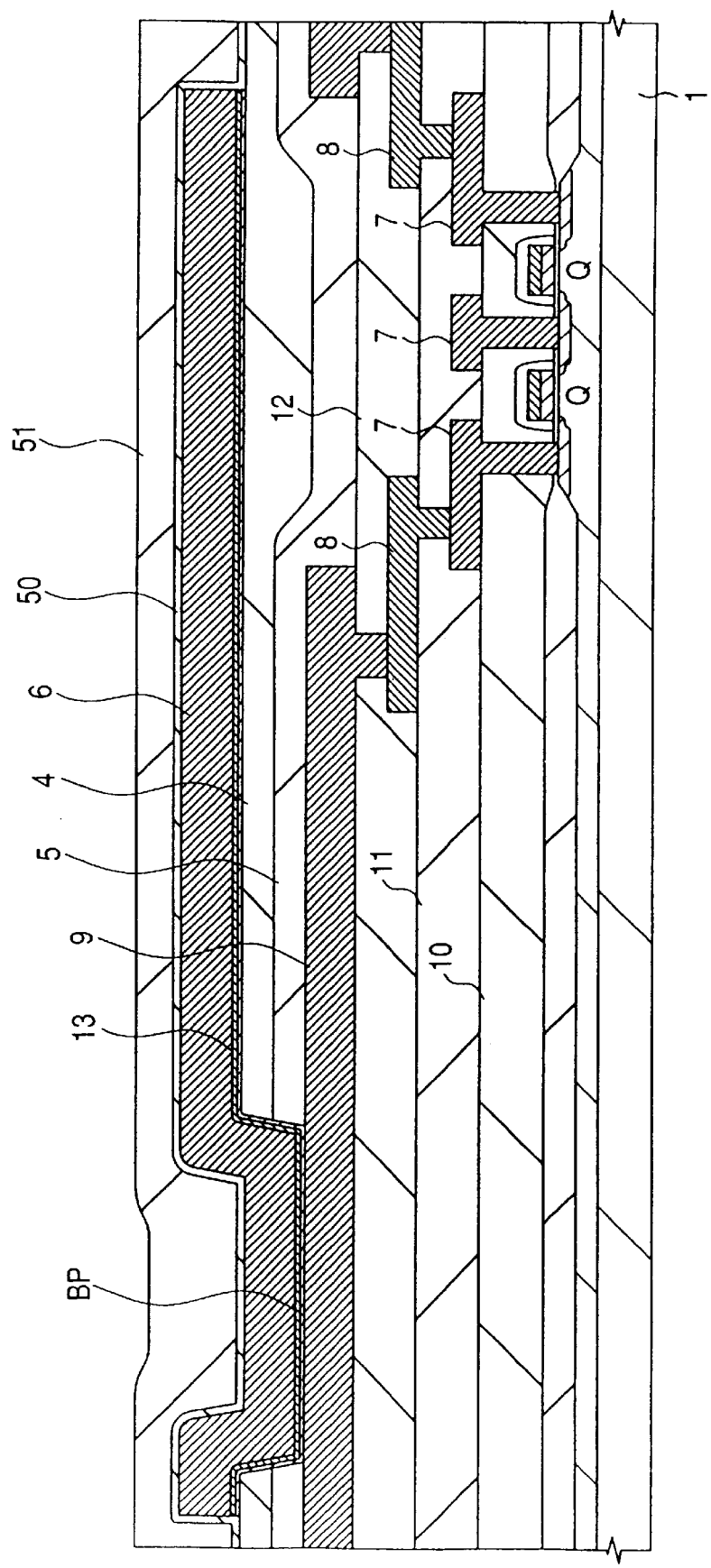
Figure 45:
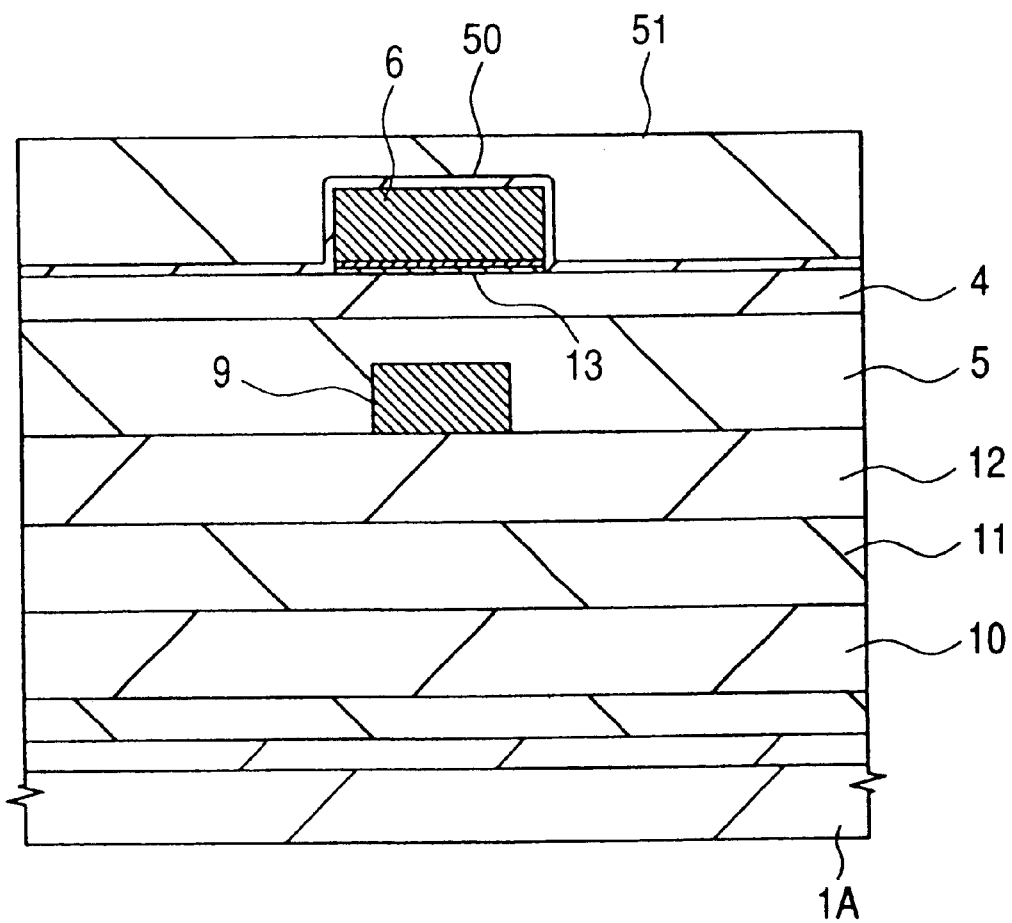

As shown in FIGS. 44 and 45, a non-photosensitive polyimide resin film having a thickness of about 5 $\mu$m to 15 $\mu$m is spin-coated on the surface of the Cu interconnection 6 and, subsequently, heat treatment (pre-baking) at 120° C. for about 30 seconds is conducted to volatilize the solvent in the polyimide resin film, thereby forming a polyimide resin layer 51.

Figure 46:
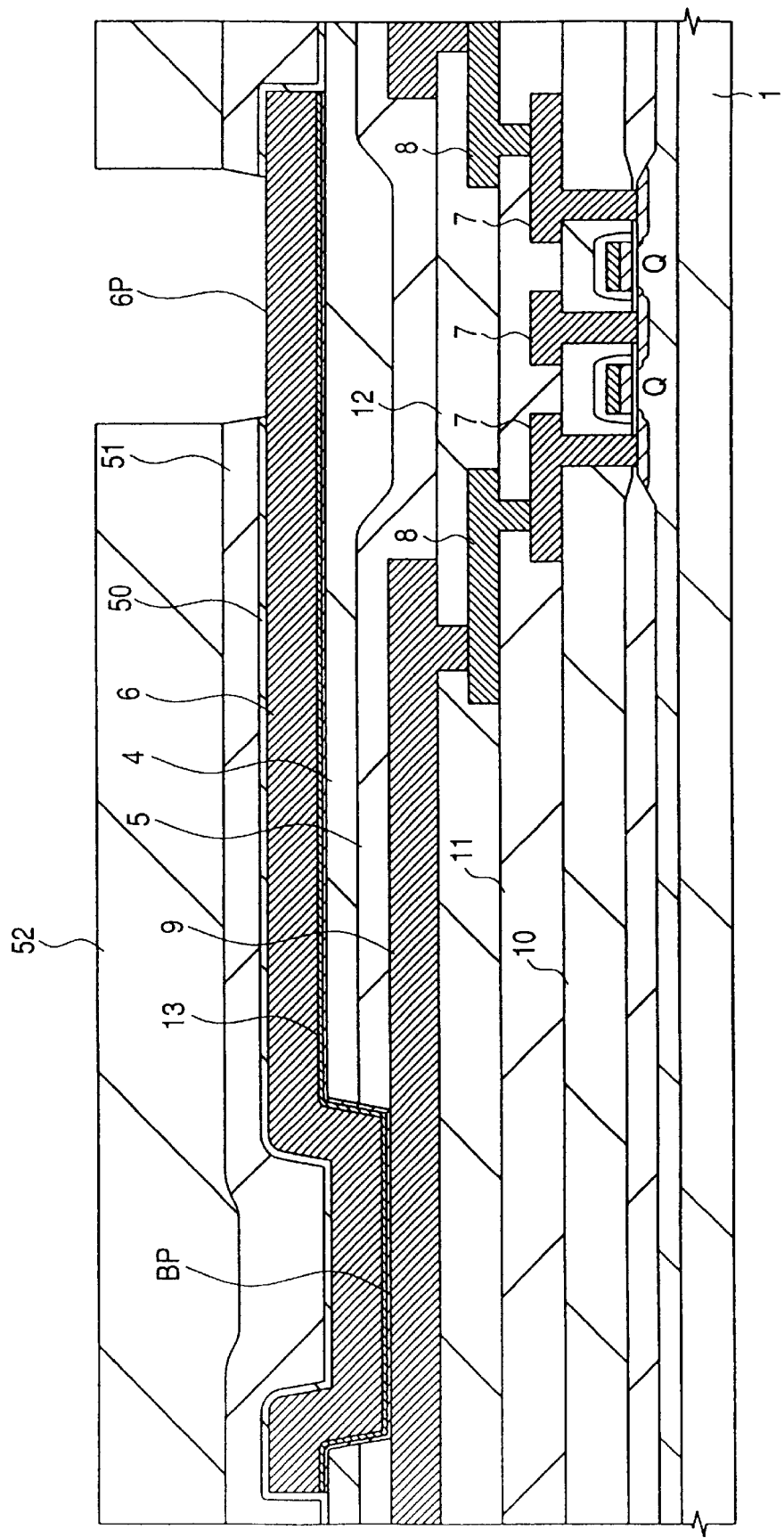

As shown in FIG. 46, a photoresist film 52 in which the bump electrode connection region is opened is formed on the polyimide resin layer 51, and the polyimide resin layer 51 and the insulating film 50 under the polyimide resin layer 51 are etched by using the photoresist film 52 as a mask, thereby forming the pad 6P.

The photoresist film 52 is removed, and the polyimide resin layer 51 is cured by performing heat treatment (post-baking) at 350° C. to 400° C. for about three hours. Since the closely-packed insulating film 51 which does not easily transmit Cu is formed on the surface of the Cu interconnection 6 covered with the polyimide resin layer 51, even when the high-temperature heat treatment for long time as described above is executed, Cu can be prevented from being diffused into the polyimide resin layer 3. Cu is not easily diffused into a non-photosensitive polyimide resin containing no photosensitive group as compared with the photosensitive polyimide resin. Consequently, in the case of making the polyimide resin layer 51 of the non-photosensitive polyimide resin, the diffusion of Cu can be more reliably prevented.

Figure 47:
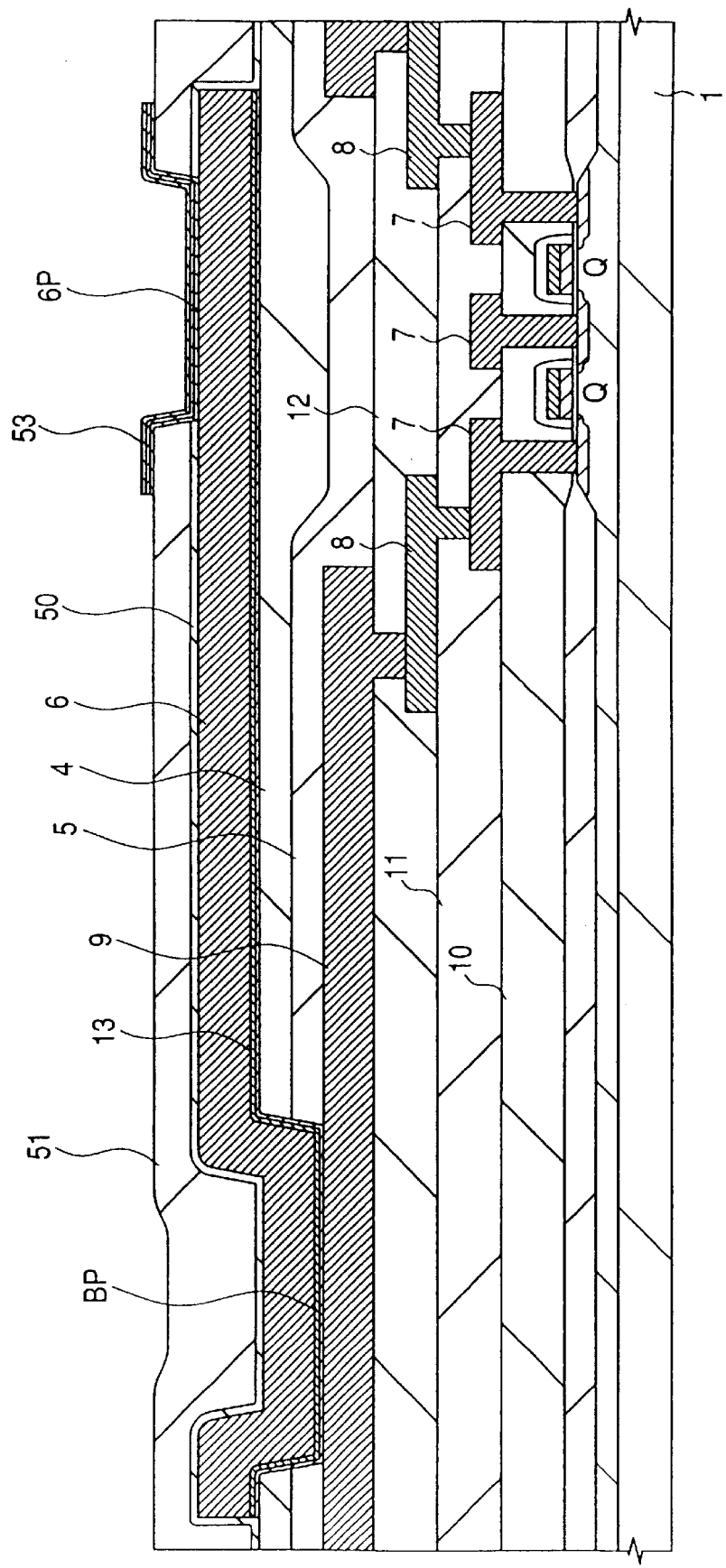

As shown in FIG. 47, a metal underlayer 53 is formed on the pad 6P and the polyimide resin layer 51 around the pad 6P. The metal underlayer 53 is formed by sequentially depositing, for example, a Cr film, an Ni—Cu alloy film, and an Au film on the polyimide resin layer 51 by sputtering, and patterning the films by etching using the photoresist film as a mask. The Cr film as the lowest layer in the metal underlayer 53 is provided to prevent an alloying reaction between the bump electrode 2 and the Cu interconnection 6 and to determine the outer diameter of the bump electrode 2. The Ni—Cu alloy film as an intermediate layer in the metal underlayer 53 is used to improve the wettability of the bump electrode 2 to thereby increase the bonding strength with the underlayer. The Au film as the uppermost layer in the metal underlayer 53 is provided to prevent corrosion due to oxidation of the Ni—Cu alloy film as a lower layer. For example, the metal underlayer 53 can have the structure such that Cr film/Ni film/Au film, Cr film/Ni—W alloy film/Au film, Cr film/Cu film/Au film, Ti film/Ni film/Au film, and Ti film/Cu film/Au film.

Figure 48:
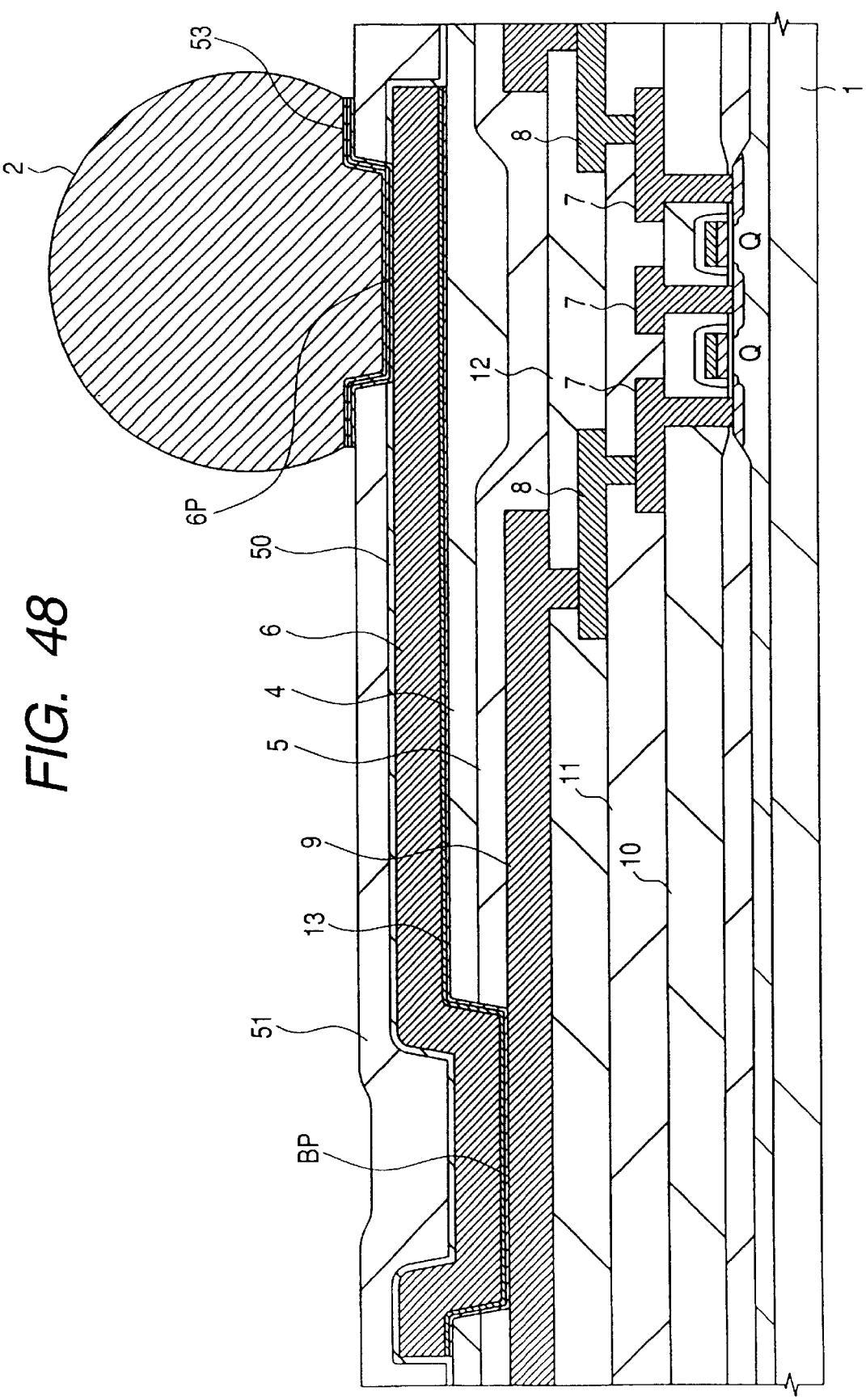
Figure 49:
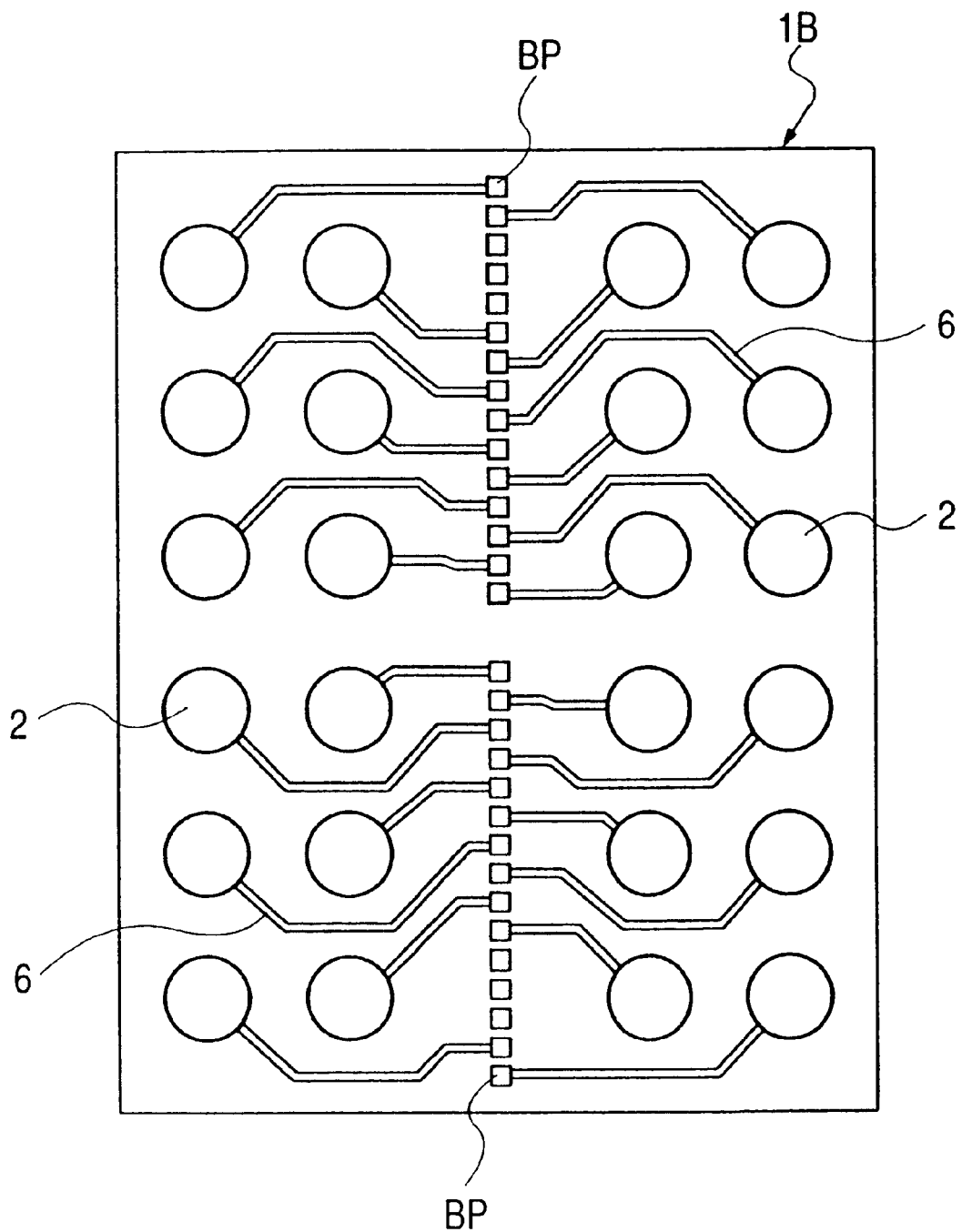
FIG. 49 is a plan view of a semiconductor device as another embodiment of the invention.

Subsequently, as shown in FIG. 48, the bump electrodes 2 are connected onto the metal underlayer 53. By using the three-layered metal film as described above as the metal underlayer 53, the connection reliability between the bump electrode 2 and the Cu interconnection 6 can be improved.

Although the present invention achieved by the inventors has been specifically described above by the embodiments, obviously, the invention is not limited to the foregoing embodiments but can be variously modified without departing from the gist.

The invention can be also applied to a CSP in which bonding pads BP arranged in the center area of a chip 1B and the bump electrodes 2 arranged in areas on both sides of the pads BP are electrically connected to each other via the Cu interconnections 6. The invention can be widely applied to a semiconductor device in which bump electrodes arranged in an area on a chip and bonding pads are electrically connected to each other via Cu interconnections, and the polyimide resin layer is formed on the Cu interconnections.

Industrial Applicability

According to the invention, since a short circuit in the cu interconnections caused by heat treatment during a manufacturing process can be prevented, a csp adapted to higher density packing and high speed operation can be realized.

What is claimed is:

1. A method of manufacturing a semiconductor device comprising the steps of:
    (a) forming a semiconductor element as a component of an integrated circuit and a predetermined number of interconnections on a principal face of a wafer and forming a surface protective film over an uppermost interconnection;
    (b) forming a bonding pad by forming a first polyimide resin layer on an upper layer of said surface protective film, and opening said first polyimide resin layer and said surface protective film to expose a part of said uppermost interconnection;
    (c) forming a long groove of which one end extends onto said bonding pad and of which other end extends in a bump electrode connection region by forming a feeder layer over said first polyimide resin layer and also over said bonding pad and exposing and developing a photoresist film formed over said feeder layer;
    (d) forming a Cu interconnection by electrolytic plating in said long groove formed in said photoresist film;
    (e) removing said photoresist film and, after that, forming a barrier layer over said feeder layer;
    (f) anisotropically etching said barrier layer and subsequently etching said feeder layer, thereby removing said feeder layer in an area other than an area under said Cu interconnection while leaving said barrier layer on the surface of said Cu interconnection;
    (g) forming a pad by forming a second polyimide resin layer over said Cu interconnection covered with said barrier layer, and opening said second polyimide resin layer in said bump electrode connection region to expose a part of said Cu interconnection;
    (h) curing said second polyimide resin layer by heating; and
    (i) connecting a bump electrode onto said pad either directly or via a metal underlayer.

2. A method of manufacturing a semiconductor device according to claim 1, wherein after said step (d) and prior to said step (e), a barrier layer is formed over the top face of said Cu interconnection by electrolytic plating.

3. A method of manufacturing a semiconductor device comprising the steps of:
    (a) forming a semiconductor element as a component of an integrated circuit and a predetermined number of interconnections on a principal face of a wafer, and thereafter forming a surface protective film over an uppermost interconnection;
    (b) forming a bonding pad by forming a first polyimide resin layer on an upper layer of said surface protective film, and thereafter opening said first polyimide resin layer and said surface protective film to expose a part of said uppermost interconnection;
    (c) forming a first long groove of which one end extends onto said bonding pad and of which other end extends in a bump electrode connection region by forming a feeder layer over said first polyimide resin layer and also over said bonding pad and thereafter exposing and developing a photoresist film formed over said feeder layer;
    (d) forming a Cu interconnection by electrolytic plating in said first long groove formed in said first photoresist film;
    (e) forming a second long groove having an area larger than that of said first long groove formed in said first photoresist film, of which one end extends onto said bonding pad and of which other end extends in a bump electrode connection region by removing said first photoresist film, and exposing and developing a second photoresist film formed over said feeder layer and also over said Cu interconnection;
    (f) forming a barrier layer by electrolytic plating in said second long groove formed in said second photoresist film, thereby covering the surface of said Cu interconnection with said barrier layer;
    (g) removing said second photoresist film and, after that, removing said feeder layer by etching using said Cu interconnection covered with said barrier layer as a mask;
    (h) forming a pad by forming a second polyimide resin layer over said Cu interconnection covered with said barrier layer, and opening said second polyimide resin layer in said bump electrode connection region to expose a part of said Cu interconnection;
    (i) curing said second polyimide resin layer by heating; and (j) connecting a bump electrode onto said pad either directly or via a metal underlayer.

4. A method of manufacturing a semiconductor device, comprising the steps of:

(a) forming a semiconductor element as a component of an integrated circuit and a predetermined number of interconnections on a principal face of a wafer and forming a surface protective film over an uppermost interconnection;

(b) forming a bonding pad by forming a first polyimide resin layer on an upper layer of said surface protective film, and opening said first polyimide resin layer and said surface protective film to expose a part of said uppermost interconnection;

(c) forming a long groove of which one end extends onto said bonding pad and of which other end extends in a bump electrode connection region by forming a feeder layer over said first polyimide resin layer and also over said bonding pad and exposing and developing a photoresist film formed over said feeder layer;

(d) forming a Cu interconnection by electrolytic plating in said long groove formed in said photoresist film;

(e) removing said photoresist film and, after that, removing said feeder layer by etching using said Cu interconnection as a mask;

(f) forming an insulating film over said Cu interconnection;

(g) forming a pad by forming a second polyimide resin layer on an upper layer of said insulating film, and opening said second polyimide resin layer in said bump electrode connection region and said insulating film under said second polyimide resin layer to expose a part of said Cu interconnection;

(h) curing said second polyimide resin layer by heating; and (i) connecting a bump electrode onto said pad either directly or via a metal underlayer, wherein said insulating film is a silicon nitride film deposited by CVD.

* * * * *